(12) United States Patent
Shibazaki

(10) Patent No.: US 8,451,425 B2
(45) Date of Patent: May 28, 2013

(54) EXPOSURE APPARATUS, EXPOSURE METHOD, CLEANING APPARATUS, AND DEVICE MANUFACTURING METHOD

(75) Inventor: Yuichi Shibazaki, Kumagaya (JP)

(73) Assignee: Nikon Corporation, Tokyo (JP)

(*) Notice: Subject to any disclaimer, the term of this patent is extended or adjusted under 35 U.S.C. 154(b) by 933 days.

(21) Appl. No.: 12/318,330

(22) Filed: Dec. 24, 2008

(65) Prior Publication Data

US 2009/0268174 A1    Oct. 29, 2009

Related U.S. Application Data

(60) Provisional application No. 61/006,734, filed on Jan. 29, 2008, provisional application No. 61/006,765, filed on Jan. 30, 2008.

(30) Foreign Application Priority Data

Dec. 28, 2007 (JP) ................................ 2007-340876
Dec. 28, 2007 (JP) ................................ 2007-340877

(51) Int. Cl.
*G03B 27/42* (2006.01)
*G03B 27/52* (2006.01)

(52) U.S. Cl.
USPC ............................................. 355/53; 355/30

(58) Field of Classification Search
USPC ......................................... 355/30, 53, 72–76
See application file for complete search history.

(56) References Cited

U.S. PATENT DOCUMENTS

| | | | |
|---|---|---|---|
| 6,208,407 | B1 | 3/2001 | Loopstra |
| 6,262,796 | B1 | 7/2001 | Loopstra et al. |
| 6,341,007 | B1 | 1/2002 | Nishi et al. |
| 6,400,441 | B1 | 6/2002 | Nishi et al. |
| 6,549,269 | B1 | 4/2003 | Nishi et al. |
| 6,590,634 | B1 | 7/2003 | Nishi et al. |
| 6,611,316 | B2 | 8/2003 | Sewell |
| 6,778,257 | B2 | 8/2004 | Bleeker et al. |
| 6,897,963 | B1 | 5/2005 | Taniguchi et al. |
| 7,023,610 | B2 | 4/2006 | Ohtsuki et al. |
| 7,110,081 | B2 | 9/2006 | Hoogendam et al. |
| 7,224,436 | B2 * | 5/2007 | Derksen et al. ................. 355/53 |
| 7,327,435 | B2 * | 2/2008 | Binnard ......................... 355/30 |

(Continued)

FOREIGN PATENT DOCUMENTS

| | | |
|---|---|---|
| JP | A-06-124873 | 5/1994 |
| JP | A-2004-289128 | 10/2004 |

(Continued)

OTHER PUBLICATIONS

International Search Report issued in International Application No. PCT/JP2008/073765 dated Apr. 7, 2009 (with translation).

(Continued)

*Primary Examiner* — Hung Henry Nguyen
(74) *Attorney, Agent, or Firm* — Oliff & Berridge, PLC

(57) ABSTRACT

An exposure apparatus exposes a substrate with exposure light via a liquid. The exposure apparatus includes: an optical member which has an emission surface from which the exposure light is emitted; a movable object which is able to move in a predetermined surface including a position facing the emission surface; and a predetermined component which is able to move between, the optical member and the movable object and which is able to form a space between which and the optical member a liquid is held.

30 Claims, 18 Drawing Sheets

U.S. PATENT DOCUMENTS

| | | | |
|---|---|---|---|
| 7,522,259 B2* | 4/2009 | Hazelton et al. | 355/30 |
| 7,583,357 B2* | 9/2009 | Donders et al. | 355/53 |
| 7,760,324 B2* | 7/2010 | Benschop et al. | 355/30 |
| 2004/0211920 A1 | 10/2004 | Maria Derksen et al. | |
| 2006/0023185 A1 | 2/2006 | Hazelton et al. | |
| 2006/0103820 A1 | 5/2006 | Donders et al. | |
| 2006/0132731 A1 | 6/2006 | Jansen et al. | |
| 2006/0227309 A1 | 10/2006 | Loopstra et al. | |
| 2007/0139632 A1* | 6/2007 | Shiraishi et al. | 355/55 |
| 2007/0288121 A1 | 12/2007 | Shibazaki | |
| 2008/0088843 A1 | 4/2008 | Shibazaki | |
| 2008/0225246 A1 | 9/2008 | Poon et al. | |

FOREIGN PATENT DOCUMENTS

| | | |
|---|---|---|
| JP | A-2006-140498 | 6/2006 |
| JP | A-2006-179909 | 7/2006 |
| JP | A-2006-523031 | 10/2006 |
| JP | A-2007-123335 | 5/2007 |
| WO | WO 01/35168 A1 | 5/2001 |
| WO | WO 2004/019128 A2 | 3/2004 |
| WO | WO 2004/021192 A1 | 3/2004 |
| WO | WO 2004/090577 A2 | 10/2004 |

OTHER PUBLICATIONS

Written Opinion of the International Searching Authority issued in International Application No. PCT/JP2008/073765 dated Apr. 7, 2009 (with translation).

Office Action issued in Singapore Patent Application No. 201004499-8 dated Jun. 6, 2011.

* cited by examiner

EXPOSURE APPARATUS, EXPOSURE METHOD, CLEANING APPARATUS, AND DEVICE MANUFACTURING METHOD

CROSS-REFERENCE TO RELATED APPLICATION

This application is a non-provisional application claiming priority to and the benefit of U.S. provisional application No. 61/006,734, filed Jan. 29, 2008 and U.S. provisional application No. 61/006,765, filed Jan. 30, 2008, and claims priority to Japanese Patent Application No. 2007-340877, filed Dec. 28, 2007 and Japanese Patent Application No. 2007-340876, filed Dec. 28, 2007. The entire contents of which are incorporated herein by reference.

BACKGROUND

1. Field of the Invention

The present invention relates to an exposure apparatus, an exposure method, a cleaning apparatus, and a device manufacturing method.

2. Related Art

In an exposure apparatus which is used in a photolithographic process, a liquid immersion exposure apparatus which exposes a substrate using exposure light via a liquid such as that described in Patent document 1 is known. In a liquid immersion exposure apparatus, at least a portion of an optical path of exposure light is filled with a liquid to form a liquid immersion space. In the exposure apparatus described in U.S. Patent Application Publication No 2004/021192, a shutter member that forms a space for holding a liquid between itself and a projection optical system is provided. The shutter member is releasably held by a substrate table, which holds a substrate, and forms a space that holds a liquid between itself and the projection optical system while being held by a seal member.

In the conventional art, the delivery of the shutter member between the substrate table and the seal member is repeated. If the delivery operations of the shutter member require considerable time, there is a possibility of deterioration in throughput.

Furthermore, in a liquid immersion exposure apparatus, there is a possibility that a surface of an object which comes into contact with the liquid in the immersion space will become contaminated. For example, if the surface of a component which has been placed in the vicinity of a substrate is left in a contaminated state, then the surface of the substrate becomes contaminated. This results in the possibility of exposure defects occurring and defective devices being created. Because of this, it is effective if the surfaces of such objects are cleaned. On the other hand, cleaning operations require considerable time, and there is a possibility such that the operating efficiency of the exposure apparatus is reduced, and there is a deterioration in throughput.

A purpose of some aspects of the present invention is to provide an exposure apparatus and an exposure method that can reduce any deterioration in throughput or occurrence of exposure defects. Another purpose is to provide a cleaning apparatus that makes it possible to perform a cleaning operation while inhibiting any reduction in operating efficiency and deterioration in throughput, and that can inhibit the occurrence of exposure defects. Still another purpose of some aspects of the present invention is to provide a device manufacturing method that can inhibit any reduction in productivity.

SUMMARY

In accordance with a first aspect of the present invention, an exposure apparatus that exposes a substrate with exposure light via a liquid is provided, the exposure apparatus comprising: an object that has a surface and that is capable of moving in a predetermined plane, the surface being to be in contact with the liquid; a first member to which the object faces and between which and the surface of the object a liquid is held; and a second member that can move in a space between the first member and the object and that can form a space to hold a liquid between the first member and the second member, wherein the object and the second member moves in a direction substantially parallel to the predetermined plane in order to switch a hold of a liquid from between the first member and one of the object and the second member to between the first member and the other one of the object and the second member.

In accordance with a second aspect of the present invention, an exposure apparatus which exposes a substrate with exposure light via a liquid is provided, the exposure apparatus comprising: an optical member which has an emission surface from which the exposure light is emitted; a movable object which is able to move in a predetermined surface including a position facing the emission surface; and a predetermined component which is able to move between the optical member and the movable object and which is able to form a space between which and the optical member a liquid is held.

In accordance with a third aspect of the present invention, an exposure apparatus which exposes a substrate with exposure light via a liquid is provided, the exposure apparatus comprising: an optical member which has an emission surface from which the exposure light is emitted; a movable object which is able to move in a predetermined surface including a position facing the emission surface; and a predetermined component which is able to form a space to hold a liquid between itself and the optical member; and a drive system which inserts the predetermined component between the optical member and the movable object, and also extracts the predetermined component from between the optical member and the movable object.

In accordance with a fourth aspect of the present invention, there is provided a device manufacturing method which includes: a step of exposing a substrate using the exposure apparatus according to the first, second or third aspect; and a step of developing the exposed substrate.

In accordance with a fourth aspect of the present invention, a method of exposing a substrate with exposure light via a liquid is provided, the method comprising: disposing an object that is capable of moving in a predetermined plane so that the object faces a first member; holding a liquid between the first member and the object; providing a second member that is capable of moving at least in a space between the first member and the object and forming a space in which a liquid is held between the second member and the first member; switching a hold of the liquid from between the first member and one of the object and the second member to between the first member and the other one of the object and the second member, the switching comprising moving the object and the second member in a direction substantially parallel to the predetermined plane.

In accordance with a sixth aspect of the present invention, a method of exposing a substrate with exposure light via a liquid is provided, the method comprising: disposing a movable object at a position which faces an emission surface of an optical member from which the exposure light emits, the movable object being capable of moving in a predetermined plane while holding the substrate; holding a liquid between the optical member and the movable object; disposing a predetermined component between the optical member and the movable object, the predetermined component being capable of moving in a direction parallel to the predetermined plane; and holding a liquid between the optical member and the predetermined component.

In accordance with a seventh aspect of the present invention, a method of exposing a substrate with exposure light via a liquid is provided, the method comprising: disposing a movable object at a position which faces an emission surface of an optical member from which the exposure light emits, the movable object being capable of moving in a predetermined plane while holding the substrate; holding a liquid between the optical member and the movable object; moving a predetermined component which is able to form a space to hold a liquid between itself and the optical member in synchronization with the movement of the movable object, to insert the predetermined component between the optical member and the movable object, and to extract the predetermined component from between the optical member and the movable object.

In accordance with an eighth aspect of the present invention, there is provided a device manufacturing method which includes: a step of exposing a substrate using the exposure method according to the fifth, sixth, or seventh aspect; and a step of developing the exposed substrate.

In accordance with a ninth aspect of the present invention, there is provided a cleaning apparatus which cleans a surface of an object which comes into contact with an exposure liquid used for immersion exposure, and includes: a first surface which holds a cleaning liquid between itself and the surface of the object; and a second surface which is placed around at least a portion of a periphery of the first surface and which is further from the surface of the object than the first surface.

In accordance with a tenth aspect of the present invention, there is provided an exposure apparatus which exposes a substrate with exposure light via an exposure liquid, and includes: a cleaning component which cleans a surface of an object which comes into contact with the exposure liquid, wherein the cleaning component has: a first surface which holds a cleaning liquid between itself and the surface of the object; and a second surface which is placed around at least a portion of a periphery of the first surface and which is further from the surface of the object than the first surface.

In accordance with an eleventh aspect of the present invention, there is provided an exposure apparatus which exposes a substrate with exposure light via an exposure liquid, and includes: a cleaning component having a first surface which is able to hold a cleaning liquid between itself and a surface of an object which comes into contact with the exposure liquid; a predetermined component which is able to form a space to hold the cleaning liquid between itself and the cleaning component; and a drive system which inserts the predetermined component between the cleaning component and the object, and also extracts the predetermined component from between the cleaning component and the object.

In accordance with a twelfth aspect of the present invention, there is provided a device manufacturing method which includes: a step of exposing a substrate using the exposure apparatus according to the tenth or eleventh aspects; and a step of developing the exposed substrate.

In accordance with a thirteenth aspect of the present invention, there is provided an exposure method in which a substrate is exposed with exposure light via an exposure liquid, the exposure method including: a step in which an object having a surface which comes into contact with the exposure liquid is moved to a cleaning station having a first surface which is able to hold a cleaning liquid between itself and the surface of the object, and a second surface which is placed around at least a portion of a periphery of the first surface; and a step in which the first surface and the surface of the object are moved relatively to each other while the cleaning liquid is in a state of being held between the first surface and the surface of the object, wherein the second surface is inclined such that a gap between itself and the surface of the object becomes gradually larger in a direction moving away from a center of the first surface.

In accordance with a fourteenth aspect of the present invention, there is provided an exposure method in which a substrate is exposed with exposure light via an exposure liquid, the exposure method including: a step in which an object having a surface which comes into contact with the exposure liquid is moved to a cleaning station where a cleaning component is located; a step in which the object is placed at a position facing a first surface of the cleaning component; a step in which cleaning liquid is held between the first surface of the cleaning component and the surface of the object; a step in which a predetermined component which is able to move substantially in parallel with the surface of the object is placed between the cleaning component and the object; and a step in which cleaning liquid is held between the cleaning component and the predetermined component.

In accordance with a fifteenth aspect of the present invention, there is provided an exposure method in which a substrate is exposed with exposure light via an exposure liquid, the exposure method including: a step in which an object having a surface which comes into contact with the exposure liquid is moved to a cleaning station where a cleaning component is located; a step in which the object is placed at a position facing a first surface of the cleaning component; a step in which cleaning liquid is held between the first surface of the cleaning component and the surface of the object; and a step in which a predetermined component which is able to form a space to hold the cleaning liquid between itself and the cleaning component is moved in synchronization with the movement of the object, and the predetermined component is inserted between the cleaning component and the object, and the predetermined component is extracted from between the cleaning component and the object.

In accordance with a sixteenth aspect of the present invention, there is provided a device manufacturing method which includes: a step of exposing a substrate using the exposure method according to the thirteenth, fourteenth, or sixteenth aspect; and a step of developing the exposed substrate.

According to some aspects of the present invention, it is possible to reduce any deterioration in throughput in exposure process and to inhibit any reduction in productivity.

According to some aspects of the present invention, it is possible to perform a cleaning operation while inhibiting any reduction in operating efficiency.

DESCRIPTION OF EMBODIMENTS

Embodiments of the present invention will now be described with reference made to the drawings, however, the present invention is not limited to these. In the description below, an XYZ rectangular coordinate system is set, and positional relationships between the respective components are described with reference made to this XYZ rectangular coordinate system. A predetermined direction within a horizontal plane is taken as an X axial direction, a direction which is orthogonal to the X axial direction within the horizontal plane is taken as a Y axial direction, while a direction which is orthogonal to both the X axial direction and the Y axial direction (namely, a vertical direction) is taken as a Z axial direction. Moreover, rotation (i.e., tilt) directions around the X axis, the Y axis, and the Z axis are taken respectively as θX, θY, and θZ directions.

Figure 1:
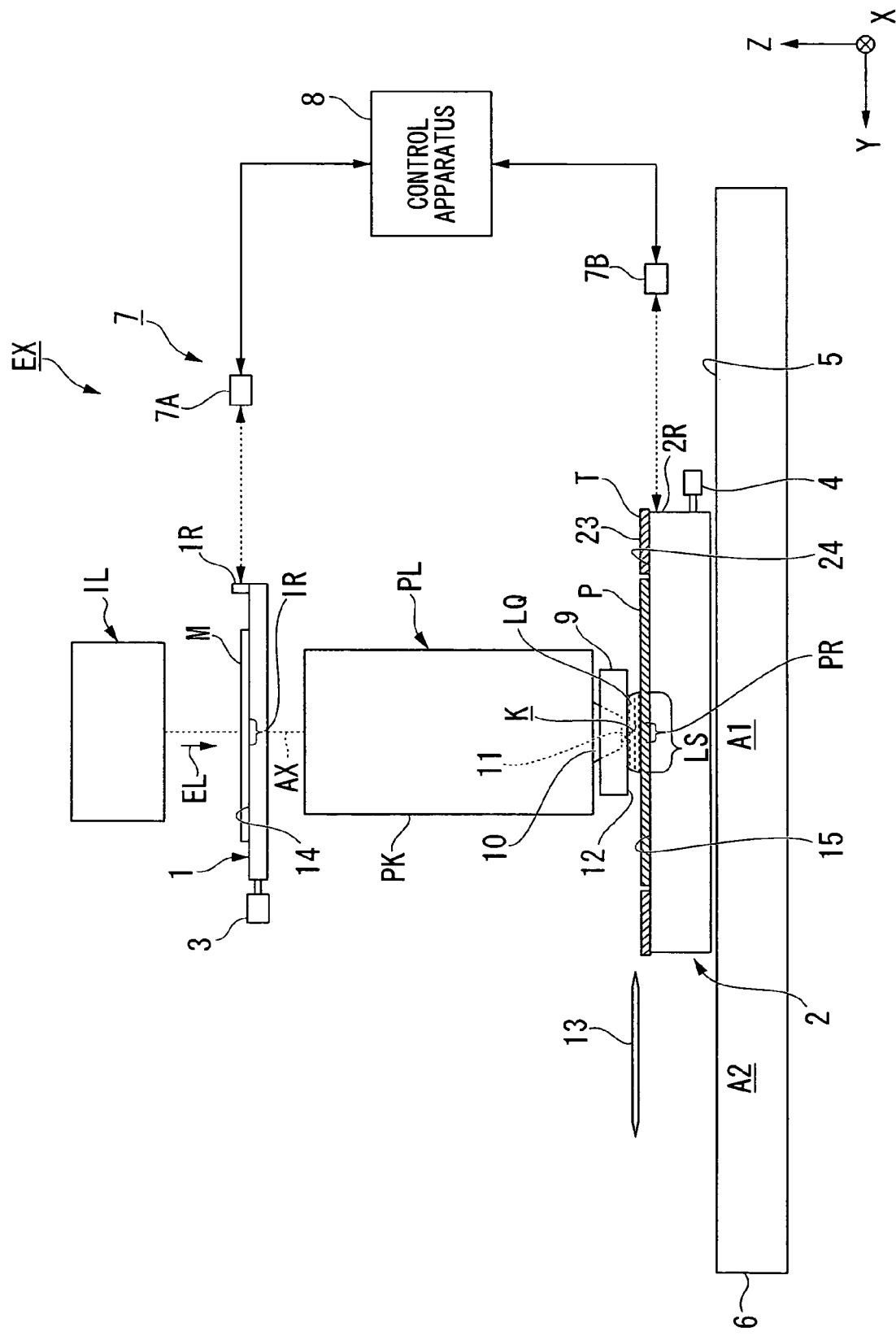
FIG. 1 is a schematic structural view showing an example of an exposure apparatus according to an embodiment.

FIG. 1 is a schematic structural view showing an example of an exposure apparatus EX according to the present embodiment. FIG. 1 is a schematic structural view showing an example of an exposure apparatus EX according to the present embodiment. In FIG. 1, the exposure apparatus EX is provided with a mask stage 1 which is able to move while holding a mask M, a substrate stage 2 which is able to move while holding a substrate P, a first drive system 3 which moves the mask stage 1, a second drive system 4 which moves the substrate stage 2, a base component (i.e., a surface plate) 6 having a guide surface 5 which movably supports the substrate stage 2, a measuring system (an interferometer system in this embodiment) 7 which is able to measure respective position information for the mask stage 1 and the substrate stage 2, an illumination system IL which illuminates the mask M by means of exposure light EL, a projection optical system PL which projects an image of a pattern on the mask M which has been illuminated by the exposure light EL onto the substrate P, and a control apparatus 8 which controls the overall operations of the exposure apparatus EX.

The mask M includes a reticle on which is formed a device pattern which is projected onto the substrate P. The mask M cab be, for example, a transmission mask which is obtained by forming a predetermined pattern on a transparent plate such as a glass plate or the like using a light-blocking film such as chrome or the like. Note also that it is also possible to use a reflective mask as the mask M. The substrate P is a substrate which is used to manufacture a device. The substrate P can be, for example, a substrate obtained by forming a photosensitive film on a base material such as a semiconductor wafer such as a silicon wafer. The photosensitive film is a film of photosensitive material (i.e., photoresist). The substrate P may also be a film other than a photosensitive film. For example, the substrate P may also be an anti-reflection film, or may be a protective coat (i.e., a top coat) which protects the photosensitive film.

The exposure apparatus EX of the present embodiment is a liquid immersion exposure apparatus that exposes a substrate P using exposure light EL via a liquid LQ. The exposure apparatus EX is provided with an immersion component 9 which is able to form an immersion space LS such that at least a portion of an optical path K of the exposure light EL is filled with the liquid LQ. The immersion space LS is a space which is filled with a liquid LQ. In the embodiment, water (pure water) is used as the liquid LQ.

In the present embodiment, the immersion space LS is formed such that the optical path K of the exposure light EL which is emitted from a terminal optical element 10, from among a plurality of optical elements of the projection optical system PL, which is closest to an image plane of the projection optical system PL is filled by the liquid LQ. The terminal optical element 10 has an emission surface 11 which emits the exposure light EL towards the image plane of the projection optical system PL. The immersion space LS is formed such that the optical path K between the terminal optical element 10 and an object which is placed at a position A1 facing the emission surface 11 of this terminal optical element 10 is filled by the liquid LQ. A position A1 facing the emission surface 11 includes a position where the exposure light EL emitted from the emission surface 11 is irradiated. In the description given below, the position A1 which faces the emission surface 11 of the terminal optical element 10 is referred to where appropriate as the first position A1.

The immersion component 9 is placed in the vicinity of the terminal optical element 10. The immersion component 9 has a bottom surface 12. In the present embodiment, an object which is able to face the emission surface 11 is able to face the bottom surface 12. When a surface of an object is placed at the first position A1, at least a portion of the bottom surface 12 faces the surface of the object. When the emission surface 11 and the surface of the object are facing each other, the terminal optical element 10 is able to hold the first liquid LQ between the emission surface 11 and the surface of the object. Moreover, when the bottom surface 12 and the surface of the object are facing each other, the first immersion component 9 is able to hold the liquid LQ between the bottom surface 12 and the surface of the object. The immersion space LS is formed by the liquid LQ which is held between the emission surface 11 and the surface of the object and between the bottom surface 12 and the surface of the object.

In the present embodiment, objects which are able to face the emission surface 11 and bottom surface 12 include objects which are able to move within a predetermined plane which includes the first position A1. In the present embodiment, these objects include at least one of the substrate stage 2 and a substrate P which is held on this substrate stage 2. In the present embodiment, the substrate stage 2 is able to move over the guide surface 5 of the base component 6. In the present embodiment, the guide surface 5 is substantially parallel with an XY plane. While holding a substrate P, the substrate stage 2 is able to move over the guide surface 5 within an XY plane which includes the first position A1.

Moreover, the exposure apparatus EX of the present embodiment is provided with a cover component 13 which is able to move to the first position A1. The cover component 13 is able to move between the terminal optical element 10 and the substrate stage 2, and is able to form a space where the liquid LQ is held between itself on one side and the terminal optical element 10 and the immersion component 9 on the other side. The cover component 13 is able to face the emission surface 11 and the bottom surface 12. In the present embodiment, the cover component 13 moves in a direction (i.e., the XY direction) which is substantially parallel with the guide surface 5. Moreover, the cover component 13 is able to move to a second position A2 which is different from the first position A1. The second position A2 includes positions which do not face the emission surface 11 and the bottom surface 12. Namely, in the present embodiment, the cover component 13 is able to move within an XY plane which includes the first position A1 and the second position A2.

The immersion component 9 is able to form the immersion space LS between itself and the substrate stage 2 (the substrate P) which is placed at the first position A1 with the liquid LQ. In addition, the immersion component 9 is able to form the immersion space LS between itself and the cover component 13 which is placed at the first position A1 with the liquid LQ.

In the present embodiment, the immersion space LS is formed such that an area of a portion of the surface of the substrate P (i.e., a localized area) which is placed at a position facing the emission surface 11 and bottom surface 12 is covered by the liquid LQ, and a boundary face of the liquid LQ (i.e., a meniscus or an edge) is formed between the surface of this substrate P and the bottom surface 12. Namely, in the present embodiment, when exposing a substrate P, the exposure apparatus EX employs a localized immersion method in which the immersion space LS is formed such that the localized area of a portion of the substrate P which includes the projection area PR of the projection optical system PL is covered by the liquid LQ.

The illumination system IL illuminates a predetermined illumination area IR using the exposure light EL which has a uniform brightness distribution. The illumination system IL illuminates at least a portion of a mask M which is placed on the illumination area IR using the exposure light EL which has a uniform brightness distribution. The exposure light EL which is emitted from the illumination system IL may be, for example, deep ultraviolet light (DUV light) such as emission rays (i.e., g-rays, h-rays, and i-rays) emitted from a mercury lamp and KrF excimer laser light (having a wavelength of 248 nm), ArF excimer laser light (having a wavelength of 193 nm), and vacuum ultraviolet light (VUV light) such as F2 laser light (having a wavelength of 157 nm). In the present embodiment, ArF excimer laser light which is ultraviolet light (i.e., vacuum ultraviolet light) is used for the exposure light EL.

The mask stage 1 has a mask holding portion 14 which holds a mask M, a pattern formation surface (i.e., a lower surface) of which is disposed at a first plane (i.e., an object plane) of the projection optical system PL. The mask holding portion 14 removably holds the mask M. In the present embodiment, the mask holding portion 14 holds a mask M such that a pattern formation surface (i.e., a bottom surface) of the mask M is substantially parallel with an XY plane.

The first drive system 3 includes an actuator such as a linear motor or the like. The mask stage 1 is able to be moved within an XY plane by an operation of the first drive system 3 while holding a mask M. In the present embodiment, the mask stage 1 is able to move in three directions, namely, the X axial direction, the Y axial direction, and the (Z direction while holding a mask M by means of the mask holding portion 14.

The projection optical system PL irradiates the exposure light EL onto a predetermined projection area PR. The projection optical system PL1 projects an image of the pattern on the mask M at a predetermined projection factor onto at least a portion of the substrate P which has been placed in the projection area PR. A plurality of optical elements of the projection optical system PL are held in a lens barrel PK. The projection optical system PL of the present embodiment is a reduction system whose projection factor is, for example, ¼, ⅕, ⅛ or the like. Note that the projection optical system PL may also be either an equalizing system or an enlargement system. In the present embodiment, the optical axis AX of the projection optical system PL is substantially parallel with the Z axis. Moreover, the projection optical system PL may be either a dioptric system that does not include any catoptric elements, a catoptric system that does not include any dioptric elements, or a catadioptric system that includes both catoptric elements and dioptric elements. Moreover, the projection optical system PL may form either an inverted image or an erect image.

The substrate stage 2 has a substrate holding portion 15 which holds a substrate P, an exposure surface (i.e., a top surface) of which is disposed at a second plane (i.e., an image plane) of the projection optical system PL. The substrate holding portion 15 removably holds the substrate P. In the present embodiment, the substrate holding portion 15 holds a substrate P such that an exposure surface (i.e., a top surface) of the substrate P is substantially parallel with an XY plane. The second drive system 4 includes, for example, an actuator such as a linear motor or the like. The substrate stage 2 is able to be moved within an XY plane by an operation of the second drive system 4 while holding a substrate P. In the present embodiment, the substrate stage 2 is able to move in six directions, namely, the X axial direction, the Y axial direction, and the Z axial direction, and in the θX, θY, and θZ directions while holding a substrate P by means of the substrate holding portion 15.

The interferometer system 7 measures respective position information within an XY plane for the mask stage 1 and the substrate stage 2. The interferometer system 7 is provided with a laser interferometer 7A which measures position information within an XY plane for the mask stage 1, and a laser interferometer 7B which measures position information within an XY plane for the substrate stage 2. The laser interferometer 7A irradiates measurement light onto a reflection surface 1R which is placed on the mask stage 1, and using measurement light which has passed through this reflection surface 1R measures position information in the X axial direction, the Y axial direction, and the θZ direction for the mask stage 1 (and the mask M).

The laser interferometer 7B irradiates measurement light onto a reflection surface 2R which is placed on the substrate stage 2, and using measurement light which has passed through this reflection surface 2R measures position information in the X axial direction, the Y axial direction, and the θZ direction for the substrate stage 2 (and the substrate P).

Moreover, in the present embodiment, a focus and leveling detection system (not shown) which detects position information for the surface of the substrate P which is held on the substrate stage 2 is also provided. The focus and leveling detection system detects position information in the Z axial direction, the θX direction, and the θY direction for the surface of the substrate P.

When a substrate P is being exposed, position information for the mask stage 1 is measured by the laser interferometer 7A, position information for the substrate stage 2 is measured by the laser interferometer 7B, and position information for the surface of the substrate P is detected by the focus and leveling detection system. Based on measurement results from the laser interferometer 7A, the control apparatus 8 executes position control for the mask M which is being held on the mask stage 1 by operating the first drive system 3. In addition, based on measurement results from the laser interferometer 7B and on detection results from the focus and leveling detection system, the control apparatus 8 executes position control for the substrate P which is being held on the substrate stage 2 by operating the second drive system 4.

The exposure apparatus EX of the present embodiment is a scanning type of exposure apparatus (what is known as a scanning stepper) which projects an image of the pattern on the mask M onto the substrate P while moving the mask M and the substrate P in synchronization in predetermined scanning directions. When exposing a substrate P, the control apparatus 8 controls the mask stage 1 and the substrate stage 2 such that the mask M and the substrate P are moved in predetermined scanning directions within an XY plane which intersect with the optical path of the exposure light EL (i.e., the optical axis AX). In the present embodiment, the scanning direction of the substrate P (i.e., the synchronous movement direction) is taken as the Y axial direction, and the scanning direction of the mask M (i.e., the synchronous movement direction) is also taken as the Y axial direction. The control apparatus 8 moves the substrate P in the Y axial direction to the projection area PR of the projection optical system PL, and also moves the mask M in the Y axial direction to the illumination area IR of the illumination system IL in synchronization with this movement of the substrate P in the Y axial direction. At the same time as this, the control apparatus 8 irradiates the exposure light EL onto the substrate P via the projection optical system PL and the liquid LQ in the immersion space LS above the substrate P. As a result, the substrate P is exposed by the exposure light EL, and an image of the pattern on the mask M is projected onto the substrate P.

Figure 2:
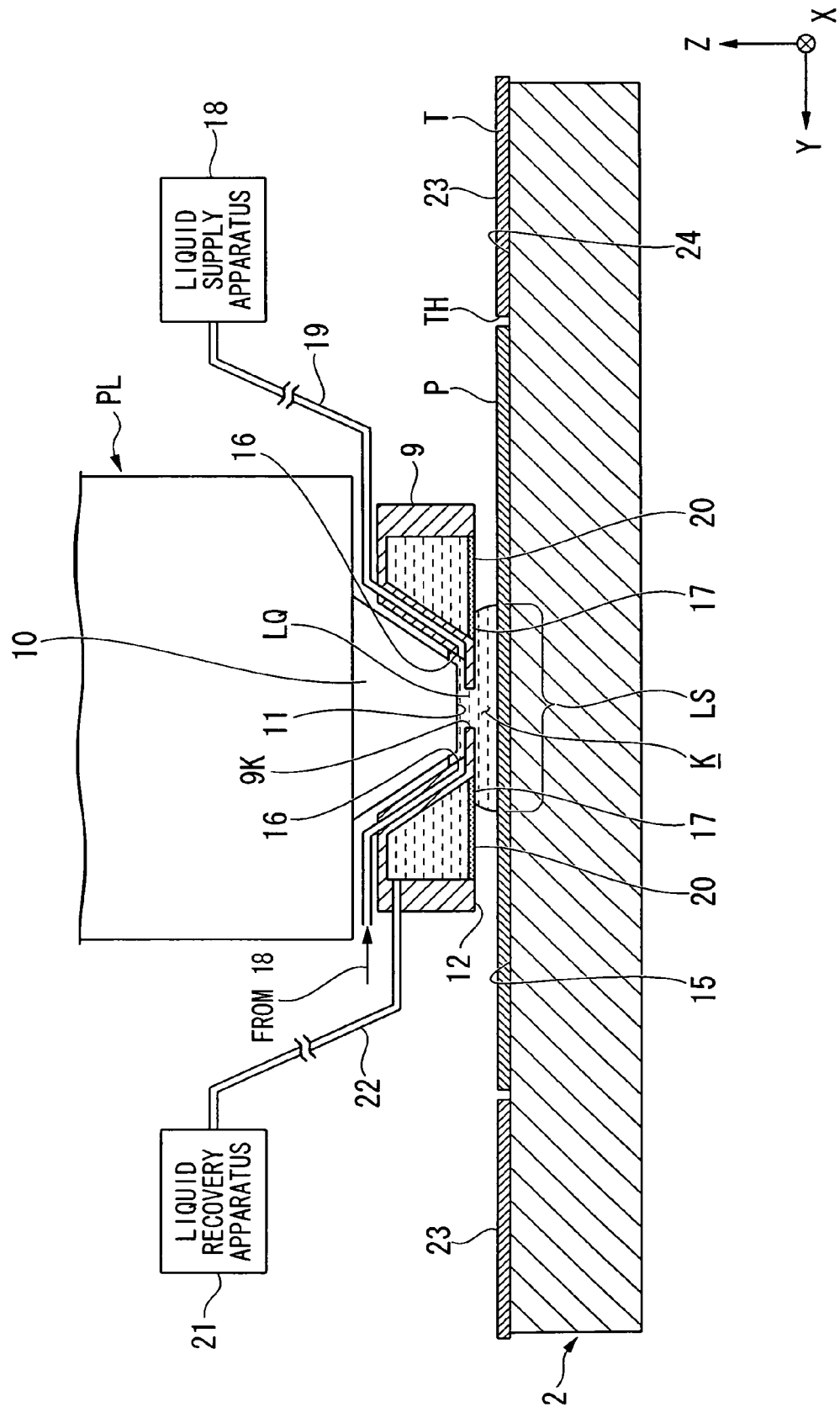
FIG. 2 is a side cross-sectional view showing a terminal optical element, an immersion component, and a substrate stage which has been place at a first position.

FIG. 2 is a side cross-sectional view showing the vicinity of the terminal optical element 10, the immersion component 9, and the substrate stage 2 which is placed at the first position A1. The immersion component 9 is a member with a shaped annular. The immersion component 9 is placed so as to surround the terminal optical element 10. The immersion component 9 has an aperture 9K at a position facing the emission surface 11. The immersion component 9 is provided with a supply port 16 which is able to supply the liquid LQ, and a recovery port 17 which is able to recover the liquid LQ.

The supply port 16 is able to supply the liquid LQ to the optical path K of the exposure light EL in order to form the immersion space LS. The supply port 16 is located adjacent to the optical path K at a predetermined position of the immersion component 9 facing this optical path K. In addition, the exposure apparatus EX is provided with a liquid supply apparatus 18. The liquid supply apparatus 18 is able to deliver liquid LQ which has been purified and temperature-adjusted. The supply port 16 and the first liquid supply apparatus 18 are connected via a flow path 19. The flow path 19 includes a supply flow path which is formed inside the immersion component 9, and a flow path which is formed by a supply pipe which connects together this supply flow path and the liquid supply apparatus 18. The liquid LQ which is delivered from the first liquid supply apparatus 18 is supplied to the supply port 16 via the flow path 19. The supply port 16 supplies the liquid LQ from the liquid supply apparatus 18 to the optical path K of the exposure light EL.

The recovery port 17 is able to recover at least a portion of the liquid LQ above an object which is facing the bottom surface 12 of the first immersion component 9. In the present embodiment, the recovery port 17 is located peripherally to the optical path K of the exposure light EL. The recovery port 17 is placed at a predetermined position of the immersion component 9 facing a surface of an object. A plate-shaped porous component 20 which includes a plurality of pores is placed in the recovery port 17. Note that a porous component, such as a mesh filter or the like, in which a large number of small pores are formed in a mesh shape may be placed in the recovery port 17. In the present embodiment, at least a portion of the bottom surface 12 of the immersion component 9 is formed by a bottom surface of the porous component 20. The exposure apparatus EX is also provided with a liquid recovery apparatus 21 which is able to recover the liquid LQ. The liquid recovery apparatus 21 includes a vacuum system, and is able to recover the liquid LQ by suction. The recovery port 17 and the liquid recovery apparatus 21 are connected via a flow path 22. The flow path 22 includes a recovery flow path which is formed inside the immersion component 9, and a flow path which is formed by a recovery pipe which connects together this recovery flow path and the liquid recovery apparatus 21. The liquid LQ which is recovered via the recovery port 17 is returned to the liquid recovery apparatus 21 through the flow path 22.

In the present embodiment, the control apparatus 8 executes a liquid supply operation which employs the supply port 16 in parallel with the liquid recovery operation which employs the recovery port 17. As a result, it is possible to form the immersion space LS using the liquid LQ between the terminal optical element 10 and immersion component 9 and the object which is facing the terminal optical element 10 and immersion component 9.

The substrate stage 2 is provided with the substrate holding portion 15 on which the substrate P can be mounted or removed. In the present embodiment, the substrate holding portion 15 includes what is known as a pin chuck mechanism. The substrate holding portion 15 holds the rear surface of the substrate P while facing the rear surface of the substrate P. A top surface 23 of the substrate stage 2 is located around the periphery of the substrate holding portion 15. The top surface 23 is able to face the emission surface 11 and the bottom surface 12. In the present embodiment, the top surface 23 is substantially parallel with an XY plane. The substrate holding portion 15 holds a substrate P such that the surface of the substrate P is substantially parallel with the XY plane. In the present embodiment, the surface of the substrate P which is being held on the substrate holding portion 15 and the top surface 23 of the substrate stage 2 are substantially parallel to each other. Moreover, in the present embodiment, the surface of the substrate P which is being held on the substrate holding portion 15 and the top surface 23 of the substrate stage 2 are placed within a substantially identical plane (i.e., are substantially flush with each other). Namely, in the present embodiment, the substrate stage 2 holds a substrate P by means of the substrate holding portion 15 such that the surface of the substrate P and the top surface 23 which is placed around the periphery of the substrate P are within a substantially identical plane.

In the present embodiment the substrate stage 2 has a plate component T which is placed around the periphery of a substrate P which is being held on the substrate holding portion 15. In the present embodiment, the plate component T is able to be mounted on or removed from the substrate stage 2. In the present embodiment, the substrate stage 2 is provided with a plate component holding portion 24 on which the plate component T is able to be mounted or removed. In the present embodiment, the plate component holding portion 24 is provided with what is known as a pin chuck mechanism. The plate component holding portion 24 is placed around the periphery of the substrate holding portion 15. The plate component holding portion 24 holds a bottom surface of the plate component T while facing this bottom surface of the plate component T.

The plate component T has an aperture TH in which a substrate P is able to be placed. The plate component T which is being held on the plate component holding portion 24 is placed around the periphery of the substrate P which is being held on the substrate holding portion 15.

In the present embodiment, an inner surface of the aperture TH of the plate component T which is being held on the plate component holding portion 24 and an outer surface of the substrate P which is being held on the substrate holding portion 15 are placed so as to face each other across a predetermined gap. The plate component holding portion 24 holds the plate component T such that a top surface of the plate component T is substantially parallel with an XY plane. In the present embodiment, the surface of the substrate P which is being held on the substrate holding portion 15 and the top surface of the plate component T which is being held on the plate component holding portion 24 are substantially parallel with each other. Moreover, in the present embodiment, the surface of a substrate P which is being held on the substrate holding portion 15 and the top surface of the plate component T which is being held on the plate component holding portion 24 are placed within a substantially identical plane (i.e., are substantially flush with each other).

Namely, in the present embodiment, the top surface 23 of the substrate stage 2 includes the top surface of the plate component T which is being held on the plate component holding portion 24.

In the present embodiment, the top surface 23 of the substrate stage 2 has liquid-repellency with respect to the liquid LQ.

In the present embodiment, the top surface 23 is formed from a liquid-repellent material such as, for example, PFA (i.e., a tetra fluoro ethylene-perfluoro alkylvinyl ether copolymer), PTFE (poly tetra fluoro ethylene), Teflon (registered trade name) and the like. In the present embodiment, the contact angle of the top surface 23 relative to the liquid LQ is, for example, 90° or more.

Figure 3:
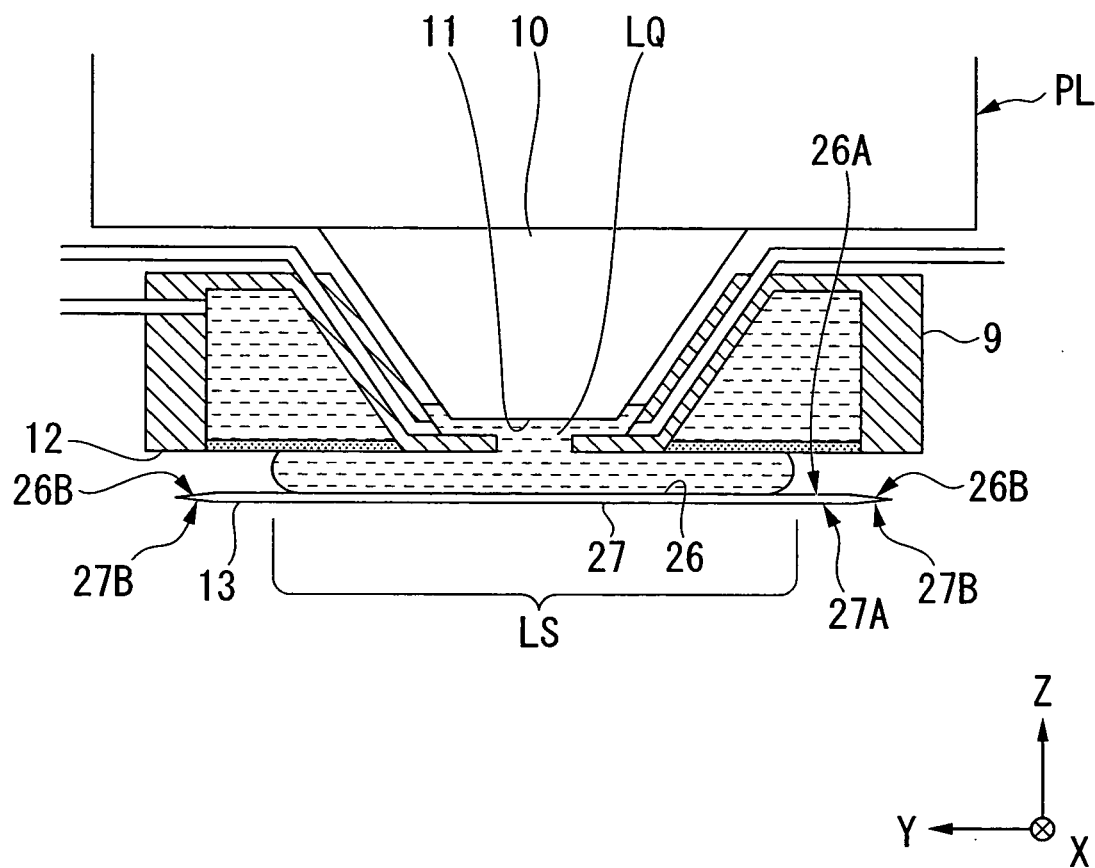
FIG. 3 is a side cross-sectional view showing a terminal optical element, a immersion component, and a cover component which has been placed at a first position.
Figure 4:
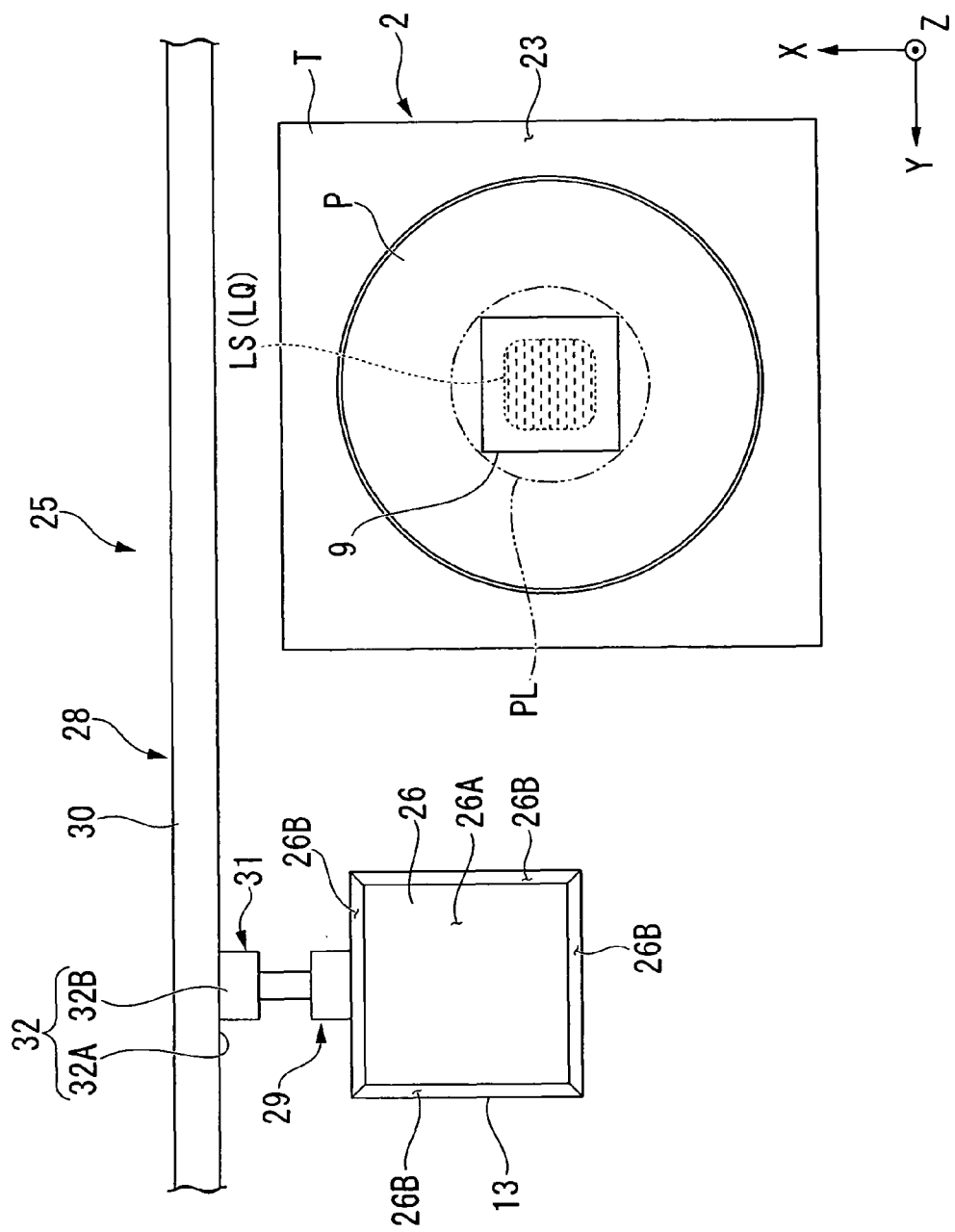
FIG. 4 is a plain view showing a cover component and a third drive system which moves the cover component.

FIG. 3 is a side cross-sectional view showing the vicinity of the terminal optical element 10, the immersion component 9, and the cover component 13 which is located at the first position A1. FIG. 4 is a plan view intended to illustrate the cover component 13 and a third drive system 25 which movably supports the cover component 13.

As is shown in FIG. 3 and FIG. 4, the cover component 13 is a plate-shaped component, and is able to hold the liquid LQ and form the immersion space LS between itself on one side and the terminal optical element 10 and the immersion component 9 on the other side. The cover component 13 is able to move in the XY direction between the emission surface 11 of the terminal optical element 10 and the top surface 23 (the surface of the substrate P) of the substrate stage 2. The cover component 13 has a top surface 26 which is able to face the emission surface 11, and a bottom surface 27 which is able to face the top surface 23 (the surface of the substrate P) of the substrate stage 2. The top surface 26 includes a level area 26A and a sloping area 26B. The level area 26A is the larger portion and includes the center of the top surface 26, and is substantially parallel with an XY plane. The sloping area 26B is the edge area of the top surface 26, and is inclined so as to gradually approach the bottom surface 27 moving in a radial direction from the center of the top surface 26. The bottom surface 27 includes a level area 27A and a sloping area 27B. The level area 27A is the majority portion and includes the center of the bottom surface 27, and is substantially parallel with the XY plane. The sloping area 27B is the edge area of the bottom surface 27, and is inclined so as to gradually approach the top surface 26 moving in a radial direction from the center of the bottom surface 27. The angle formed by the sloping area 26B of the top surface 26 and the sloping area 27B of the bottom surface 27 is an acute angle. Namely, in the present embodiment, the edges of the cover component 13 have an acute angle.

In the present embodiment, the top surface 26 and the bottom surface 27 of the cover component 13 have liquid-repellency to the liquid LQ. In the present embodiment, the cover component 13 includes a base material made, for example, from a metal such as stainless steel and the like, and a film of liquid-repellent material which is formed on the surface of this base material. The liquid-repellent material comprises, for example, PFA (i.e., a tetra fluoro ethylene-perfluoro alkylvinyl ether copolymer), PTFE (poly tetra fluoro ethylene), Teflon (registered trade name) and the like. Note that the material used to form the film may also be an acrylic-based resin, or a silicon-based resin. Moreover, it is also possible for the entire cover component 13 to be formed from at least one of PFA, PTFE, Teflon (registered trade name), an acrylic-based resin, or a silicon-based resin. In the present embodiment, the contact angles of the top surface 26 and the bottom surface 27 of the cover component 13 relative to the liquid LQ maybe, for example, 90° or more.

The third drive system 25 supports the cover component 13 such that it is able to move in the XY direction. As is shown in FIG. 4, in the present embodiment, the third drive system 25 includes a first drive apparatus 28 which is able to move the cover component 13 in the Y axial direction at a predetermined stroke, and a second drive apparatus 29 which is able to move the cover component 13 in the X axial direction, the Y axial direction, and the θZ direction. The first drive apparatus 28 includes a guide component 30 which is elongated in the Y axial direction, and a linear motor 32 that moves a supporting mechanism 31 which supports the cover component 13 in the Y axial direction along the guide component 30. The linear motor 32 includes a fixed element 32A which is placed on the guide component 30 and includes, for example, a coil, and a movable element 32B which is placed on the supporting mechanism 31 and includes, for example, magnets. The second drive apparatus 29 includes, for example, a linear motor or a voice coil motor or the like which is placed on the supporting mechanism 31, and is able to move the cover component 13 in the X axial direction, the Y axial direction, and the θZ direction.

The third drive system 25 is provided separately from the substrate stage 2. In addition, the second drive system 4 and the third drive system 25 are provided separately from each other. The control apparatus 8 is able to control the third drive system 25 independently from the second drive system 4.

In the present embodiment, when the substrate stage 2 has been separated from the terminal optical element 10, the cover component 13 is located at the first position A1. For example, when the substrate stage 2 moves to a substrate switching position, the cover component 13 is located at the first position A1 and hold the liquid LQ and form the immersion space LS between itself on one side and the terminal optical element 10 and the immersion component 9 on the other side. Note that the substrate switching position is a position separated from the terminal optical element 10 and the first immersion component 9, namely, a position which does not face the emission surface 11 and the bottom surface 12, and includes a loading position where an operation to load a substrate P onto the substrate stage 2 prior to its exposure is executed, and an unloading position where an operation to transport a substrate P away from the substrate stage 2 after its exposure is executed. The loading position and the unloading position can be the same position or can be different positions.

Moreover, when the substrate stage 2 is located at the first position A1, the cover component 13 is able to move to a second position A2 which does not face the emission surface 11 and the bottom surface 12. For example, when the substrate P held on the substrate stage 2 is exposed, the control apparatus 8 exposes the substrate P held on the substrate stage 2, in a state in which the cover component 13 is located at the second position A2 which does not face the emission surface 11 and the bottom surface 12.

As is shown in FIG. 2, in the present embodiment, the substrate stage 2 is able to form a space to hold the liquid LQ between itself on one side and the terminal optical element 10 and the immersion component 9 on the other side and facing the emission surface 11 and bottom surface 12, and thereby form the immersion space LS. Moreover, as is shown in FIG. 3, the cover component 13 is able to form a space to hold the liquid LQ between itself on one side and the terminal optical element 10 and the immersion component 9 on the other side and facing the emission surface 11 and the bottom surface 12, and thereby form the immersion space LS. In the present embodiment, the control apparatus 8 places at least one of the cover component 13 and the substrate stage 2 at the first position A1, and is able to continuously form a space to hold the liquid LQ between the terminal optical element 10 and the immersion component 9 on one side and at least one of the cover component 13 and the substrate stage 2 on the other side.

In the present embodiment, the control apparatus 8 is able to place at least one of the cover component 13 and the substrate stage 2 at the first position A1, and is able to continuously form the immersion space LS. The control apparatus 8 controls the second drive system 4 and the third drive system 25, and using the relative movement in the XY direction between the cover component 13 and the substrate stage 2, is able to switch between the cover component 13 and the substrate stage 2 to hold the liquid LQ between itself on one side and the terminal optical element 10 and the immersion component 9 on the other side. Thereby, the immersion space LS is continuously formed even if the substrate stage 2 is moved to a separated position from the first position A1, such as the substrate exchanging position and the like, and the terminal optical element 10 keeps contacting with the liquid LQ.

Moreover, in the present embodiment, the control apparatus 8 controls the third drive system 25 such that the cover component 13 can be inserted between the terminal optical element 10 and the substrate stage 2 which has been placed at the first position A1, and such that the cover component 13 can be extracted from between the terminal optical element 10 and the substrate stage 2 which is placed at the first position A1. The control apparatus 8 executes at least one of an operation to insert the cover component 13 and an operation to extract the cover component 13 in order to switch from one of the cover component 13 and the substrate stage 2 to the other one for holding the liquid LQ between itself on one side and the terminal optical element 10 and the immersion component 9 on the other side.

Next, a description will be given of an example of an operation of the exposure apparatus EX having the above described structure. In order to perform immersion exposure of the substrate P which is being held on the substrate stage 2, the control apparatus 8 forms the immersion space LS between the terminal optical element 10 and first immersion component 9 and the substrate stage 2 which has been placed at the first position A1. The control apparatus 8 then emits the exposure light EL using the illumination system IL in order to expose the substrate P. The exposure light EL which has been emitted from the illumination system IL illuminates a mask M. The exposure light EL which has passed through the mask M is irradiated onto the substrate P via the projection optical system PL and the liquid LQ in the immersion space LS. As a result, an image of the pattern on the mask M is projected onto the substrate P, and the substrate P is exposed by the exposure light EL.

While the substrate stage 2 is being exposed, the cover component 13 is placed at the second position A2 which does not face the emission surface 11 and the bottom surface 12.

After the substrate P has been exposed, the control apparatus 8 continues to operate the liquid supply with the supply port 16 and to operate the liquid recovery with the recovery port 17, and starts an operation to switch from the substrate stage 2 to the cover component 13 for holding the liquid LQ between itself on one side and the terminal optical element 10 and the immersion component 9 on the other side. In order to switch from the substrate stage 2 to the cover component 13 for holding the liquid LQ between itself on one side and the terminal optical element 10 and the immersion component 9 on the other side, the control apparatus 8 starts an operation to insert the cover component 13 between the terminal optical system 10 and the immersion component 9 on one side and the substrate stage 2 on the other side in a state in which the immersion space LS has been formed.

A description will now be given of an example of an operation to switch from the substrate stage 2 to the cover component 13 for holding the liquid LQ between itself on one side and the terminal optical element 10 and the immersion component 9 on the other side with reference made to the typical views in FIG. 5 through FIG. 7.

In the present embodiment, when performing this switching, the control apparatus 8 moves the cover component 13 and the substrate stage 2 essentially in the same direction. In the present embodiment, as an example, a case is described in which the cover component 13 and the substrate stage 2 are each moved in the −Y direction. Alternatively, the moving direction of the cover component 13 can be different from the moving direction of the substrate stage 2, within a range in which the leakage of the liquid LQ in the immersion space would not occur while moving.

Moreover, in the present embodiment, during the switching, the control apparatus 8 moves the cover component 13 and the substrate stage 2 independently at different speeds. The control apparatus 8 moves the cover component 13 in the −Y direction at a speed Vb, and moves the substrate stage 2 in the −Y direction at a speed Vs. In the present embodiment, when the hold of the liquid LQ between itself on one side and the terminal optical element 10 and the immersion component 9 on the other side is switched from the substrate stage 2 to the cover component 13, the substrate stage 2 is moved at a faster speed than the cover component 13.

Figure 5:
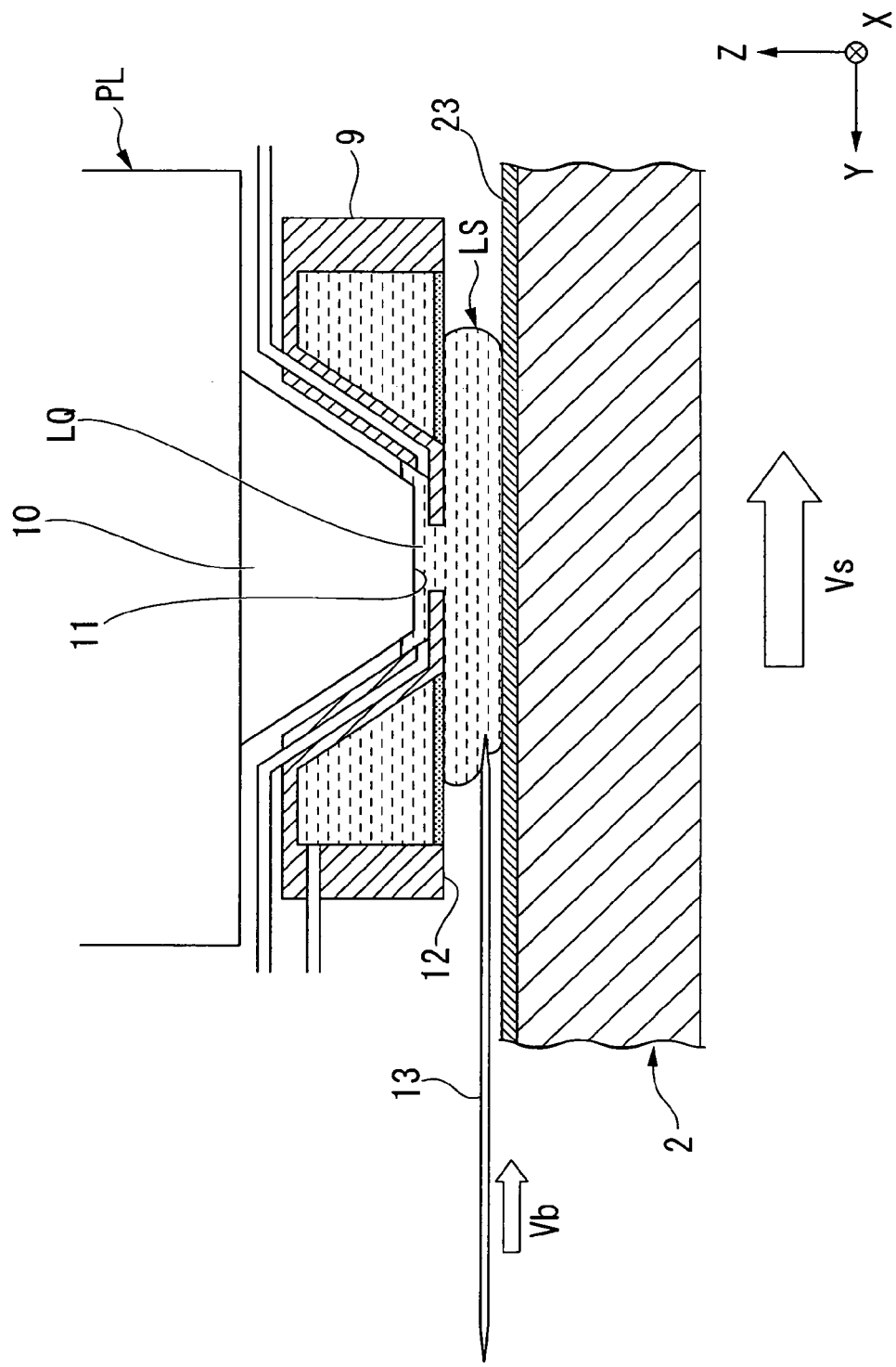
FIG. 5 is a typical view used to illustrate an example of an operation of the exposure apparatus.

As is shown in FIG. 5, in a state in which the liquid LQ is being held between the terminal optical element 10 and the immersion component 9 on one side and the substrate stage 2 on the other side, the control apparatus 8 inserts the cover component 13, which is located at the second position A2, between the terminal optical element 10 and the immersion component 9 on one side and the substrate stage 2 on the other side so as to move it to the first position A1. In the present embodiment, the second position A2 is a position on the +Y side of the first position A1. The control apparatus 8 moves the cover component 13 in the −Y direction in synchronization with the movement of the substrate stage 2 in the −Y direction so that the cover component 13 is inserted between the terminal optical element 10 and the immersion component 9 on one side and the substrate stage 2 on the other side. When the cover component 13 is being inserted, the control apparatus 8 moves the cover component 13 at the speed Vb which is slower than the speed Vs of the substrate stage 2. As a result of the substrate stage 2 being moved in the −Y direction and the cover component 13 being moved in the −Y direction, the liquid LQ changes from the state shown in FIG. 5 to the state shown in FIG. 7 through the state shown in FIG. 6.

Figure 6:
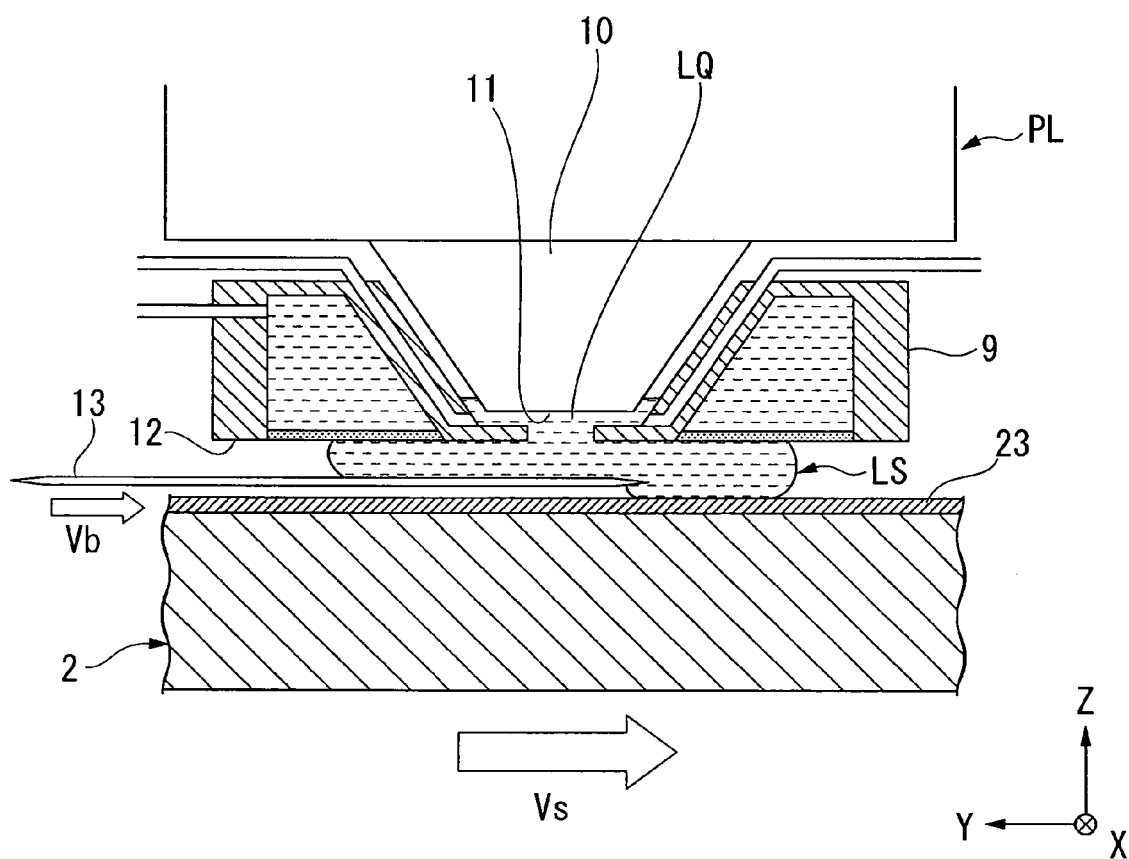
FIG. 6 is a typical view used to illustrate an example of an operation of the exposure apparatus.
Figure 7:
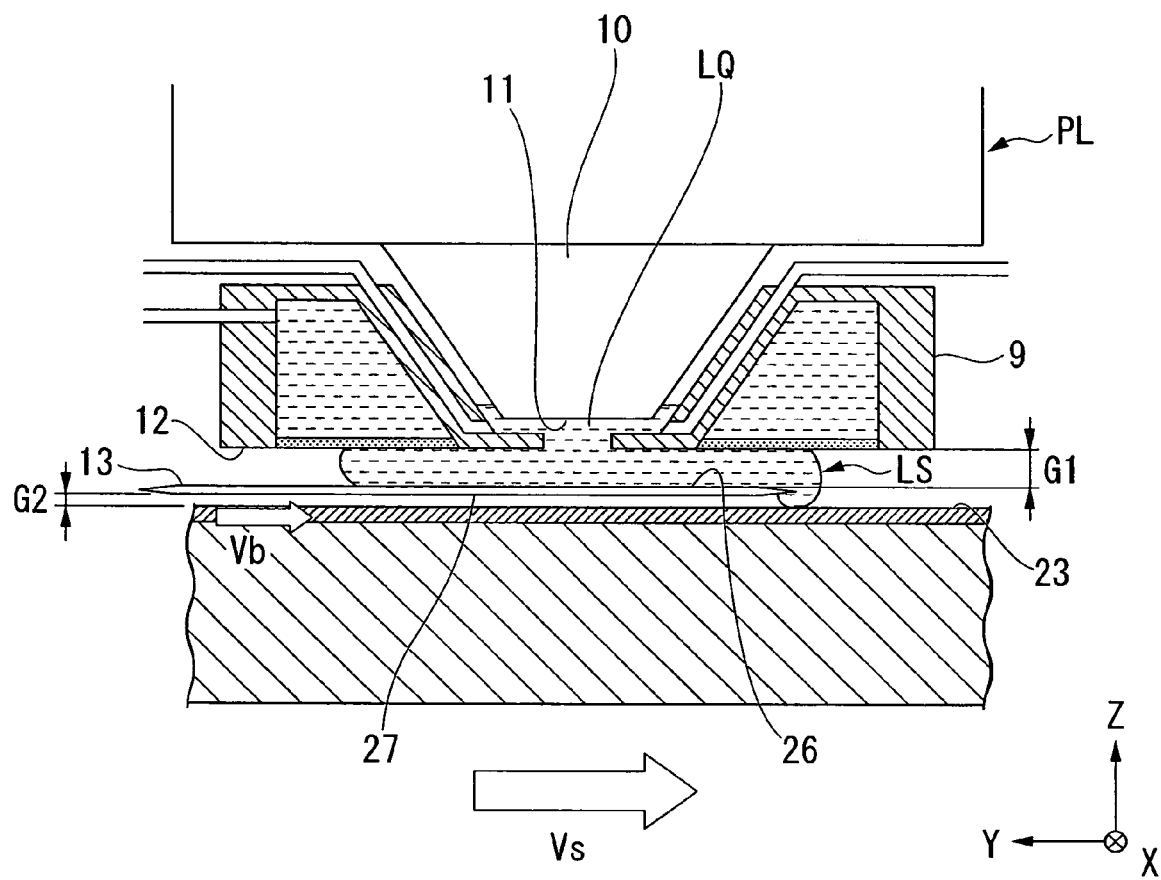
FIG. 7 is a typical view used to illustrate an example of an operation of the exposure apparatus.

As shown in FIG. 5 through FIG. 7, the control apparatus 8 executes an operation to insert the cover component 13 such that the cover component 13 does not contact with the terminal optical element 10, the immersion component 9, and the substrate stage 2. The cover component 13 is moved with being separated from the terminal optical element 10, the immersion component 9, and the substrate stage 2.

In the present embodiment, as shown in FIG. 7, a distance G1 between the bottom surface 12 of the immersion component 9 and the top surface 26 of the cover component 13 is greater than a distance G2 between the top surface 23 of the substrate stage 2 and the bottom surface 27 of the cover component 13.

After the cover component 13 has been moved to the first position A1 and the operation to insert the cover component 13 has ended, the liquid LQ is held between the terminal optical element 10 and the immersion component 9 on one side and the cover component 13 disposed at the first position A1 on the other side, so that the immersion space LS is formed. Moreover, when the operation to insert the cover component 13 has ended, the liquid LQ is eliminated from between the cover component 13 and the substrate stage 2.

In the present embodiment, when the hold of the liquid LQ between itself on one side and the terminal optical element 10 and the immersion component 9 on the other side is switched from the substrate stage 2 to the cover component 13, that is, when the cover component 13 is inserted into between the terminal optical element 10 and the immersion component 9 on one side and the substrate stage 2 on the other side, the substrate stage 2 has a faster speed Vs than a speed Vb of the cover component 13. By employing this mode, after the operation to insert the cover component 13 (i.e., after the cover component 13 has been placed at the first position A1), any ingress of the liquid LQ to the area between the cover component 13 and the substrate stage 2 is prevented, and the liquid LQ is eliminated from between the cover component 13 and the substrate stage 2, as shown in FIG. 7 and the like. For example, any ingress of the liquid LQ to the area between the cover component 13 and the substrate stage 2 is prevented by the surface tension of the liquid LQ. Accordingly, it is possible to prevent the liquid LQ remaining on the top surface 23 of the substrate stage 2 and the surface of the substrate P. It is also possible to prevent the liquid LQ adhering to or remaining on the bottom surface 27 of the cover component 13. As a result, it is possible to inhibit that the remaining liquid drops from the cover component 13 and adheres to the substrate stage 2 and the like.

Moreover, in the present embodiment, because the edges of the cover component 13 are formed at an acute angle (i.e., are sharp), during an operation to insert the cover component 13, it is possible to more effectively prevent any ingress of the liquid LQ to the area between the cover component 13 and the substrate stage 2, and to also more effectively prevent the liquid LQ becoming adhered to the bottom surface 27 of the cover component 13.

Moreover, in the present embodiment, the top surface 26 and bottom surface 27 of the cover component 13 are liquid-repellent towards the liquid LQ, and the top surface 23 of the substrate stage 2 is also liquid-repellent with respect to the liquid LQ. Therefore, during an operation to insert the cover component 13, it is possible to more effectively prevent any ingress of the liquid LQ to the area between the cover component 13 and the substrate stage 2, and to also more effectively prevent the liquid LQ becoming adhered to the bottom surface 27 of the cover component 13.

After the liquid LQ has been held between the terminal optical element 10 and the immersion component 9 on one side and the cover component 13 on the other side, the substrate stage 2 is away from the terminal optical element 10 and the immersion component 9 and is moved to the substrate switching position. As a result, as shown in FIG. 3, in a state in which the substrate stage 2 is away from the terminal optical element 10 and the immersion component 9, the cover component 13 located at the first position A1 is used for holding the liquid LQ between itself on one side and the terminal optical element 10 and the immersion component 9 on the other side.

In a state in which the liquid LQ is being held between the terminal optical element 10 and the immersion component 9 on one side and the cover component 13 on the other side, the control apparatus 8 controls the substrate stage 2 away from the terminal optical element 10 and the immersion component 9 and moves the substrate stage 2 to the substrate switching position, and then the exchange of the substrate P with respect to the substrate stage 2 is performed. In other words, at the substrate switching position, the post-exposure-processed substrate P is carried out from the substrate stage 2 and the pre-exposure-processed substrate P is carried in to the substrate stage 2.

After the exchange of the substrate P with respect to the substrate stage 2 has ended, the control apparatus 8 continues to operate the liquid supply with the supply port 16 and to operate the liquid recovery with the recovery port 17, and starts an operation to switch from the cover component 13 to the substrate stage 2 for holding the liquid LQ between itself on one side and the terminal optical element 10 and the immersion component 9 on the other side. In order to switch from the substrate stage 2 to the cover component 13 for holding the liquid LQ between itself on one side and the terminal optical element 10 and the immersion component 9 on the other side, the control apparatus 8 starts an operation to extract the cover component 13 from between the terminal optical system 10 and the immersion component 9 on one side and the substrate stage 2 on the other side, in a state in which the immersion space LS has been formed.

A description will now be given of an example of an operation to switch from the cover component 13 to the substrate stage 2 for holding the liquid LQ between itself on one side and the terminal optical element 10 and the immersion component 9 on the other side, with reference made to the typical views in FIG. 8 and FIG. 9.

In the present embodiment, when performing this switching, the control apparatus 8 moves the cover component 13 and the substrate stage 2 essentially in the same direction. In the present embodiment, as an example, a case is described in which the cover component 13 and the substrate stage 2 are each moved in the +Y direction. Alternatively, the moving direction of the cover component 13 can be different from the moving direction of the substrate stage 2, within a range in which the leakage of the liquid LQ in the immersion space would not occur while moving.

Moreover, in the present embodiment, during the switching, the control apparatus 8 moves the cover component 13 and the substrate stage 2 independently at different speeds. The control apparatus 8 moves the cover component 13 in the +Y direction at a speed Vb, and moves the substrate stage 2 in the +Y direction at a speed Vs. In the present embodiment, when the hold of the liquid LQ between itself on one side and the terminal optical element 10 and the immersion component 9 on the other side is switched from the cover component 13 to the substrate stage 2, the cover component 13 is moved at a faster speed than the substrate stage 2.

Figure 8:
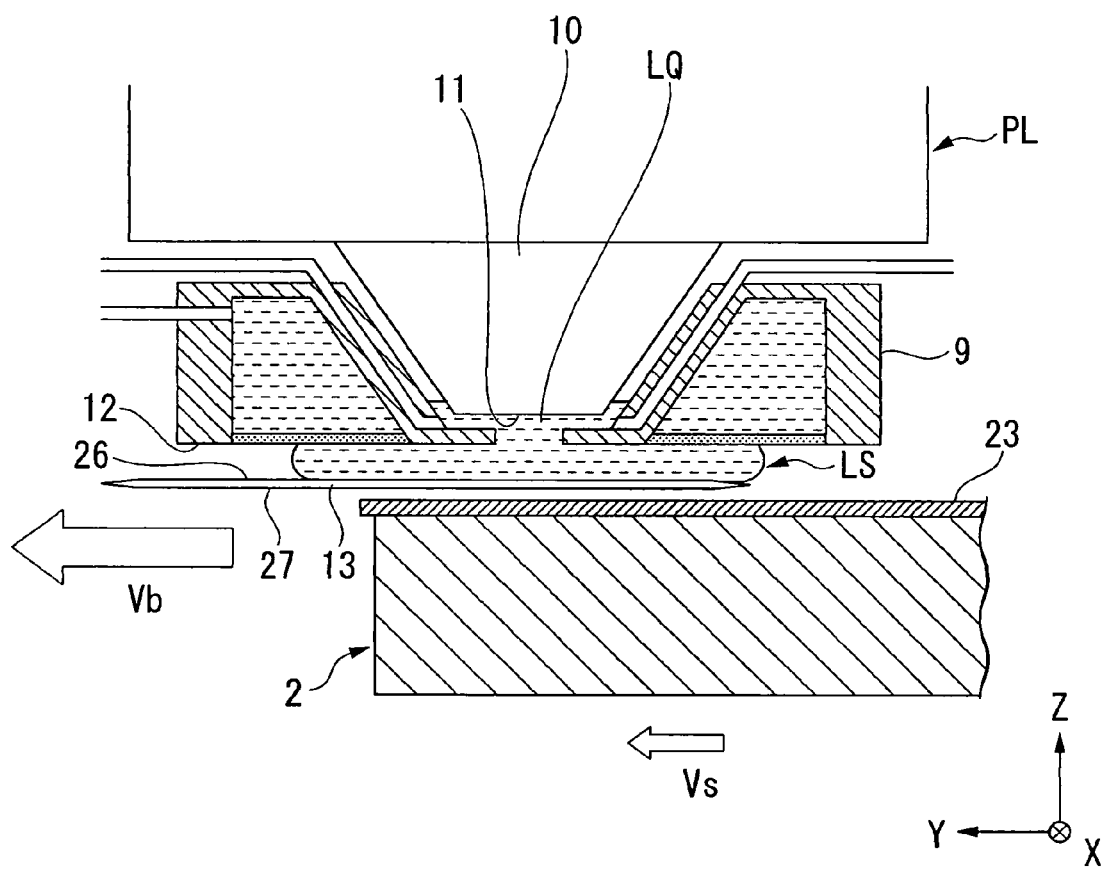
FIG. 8 is a typical view used to illustrate an example of an operation of the exposure apparatus.
Figure 9:
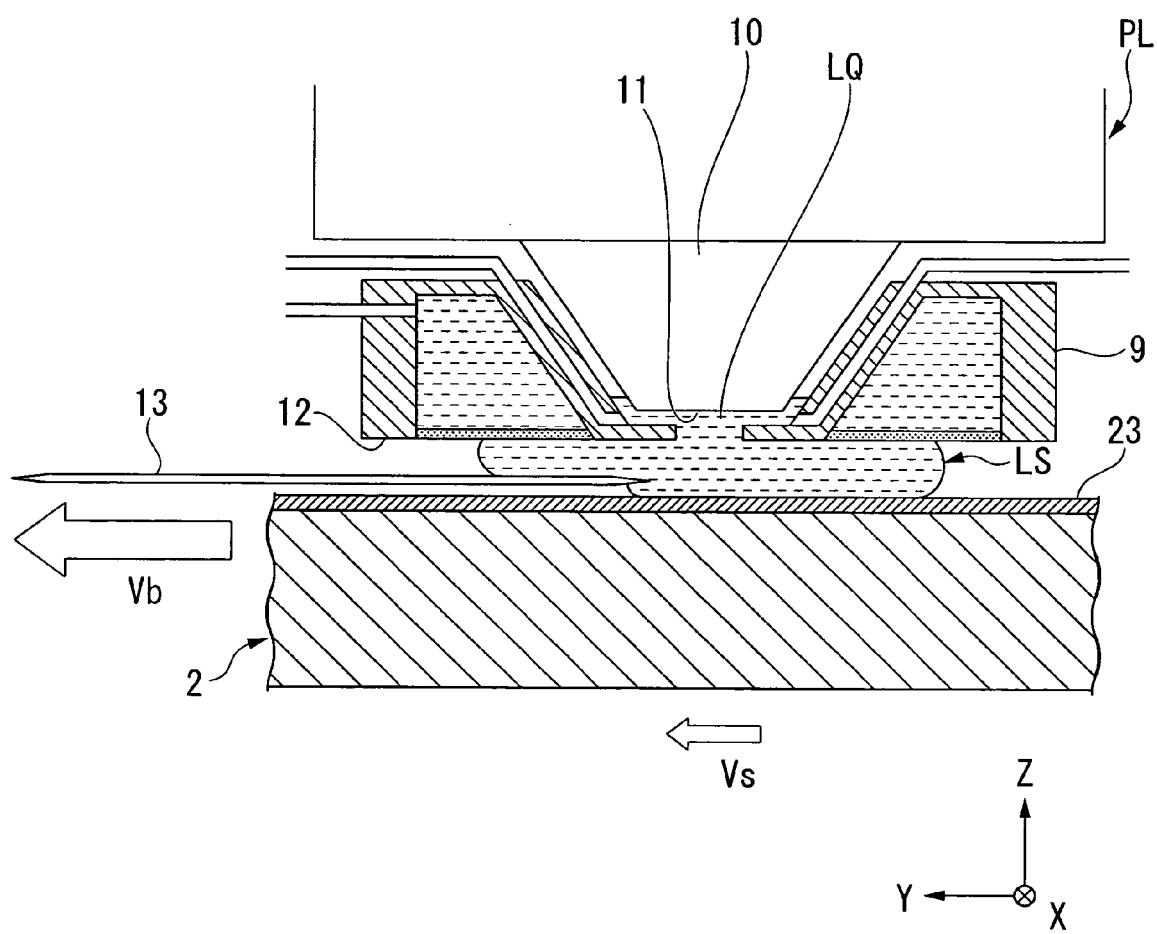
FIG. 9 is a typical view used to illustrate an example of an operation of the exposure apparatus.

As is shown in FIG. 8, in a state in which the liquid LQ is being held between the terminal optical element 10 and the immersion component 9 on one side and the cover component 13 on the other side, the control apparatus 8 moves the substrate stage 2 to the first position A1. Namely, the control apparatus 8 moves the substrate stage 2 to a position where it faces at least a portion of the bottom surface 27 of the cover component 13 which is holding the liquid LQ between itself on one side and the terminal optical element 10 and the immersion component 9 on the other side. As a result, the cover component 13 is disposed between the terminal optical element 10 and the immersion component 9 on one side and the substrate stage 2 on the other side.

The control apparatus 8 extracts the cover component 13 which is located at the first position A1 from between terminal optical element 10 and the immersion component 9 on one side and the substrate stage 2 on the other side. In the present embodiment, the second position A2 is a position on the +Y side of the first position A1. The control apparatus 8 moves the cover component 13 in the +Y direction in synchronization with the movement of the substrate stage 2 in the +Y direction so that the cover component 13 is extracted from between the terminal optical element 10 and the immersion component 9 on one side and the substrate stage 2 on the other side. The control apparatus 8 extracts the cover component 13 while the liquid LQ is in a state of being held between the terminal optical element 10 and the immersion component 9 on one side and the cover component 13 on the other side.

When the cover component 13 is being extracted, the control apparatus 8 moves the cover component 13 at the speed Vb which is faster than the speed Vs of the substrate stage 2. As a result of the substrate stage 2 being moved in the +Y direction and the cover component 13 being moved in the +Y direction, the liquid LQ changes from the state shown in FIG. 8 to the state shown in FIG. 9.

After the cover component 13 has been moved to the second position A2 and the operation to extract the cover component 13 has ended, the liquid LQ is held between the terminal optical element 10 and the immersion component 9 on one side and the substrate stage 2 disposed at the first position A1 on the other side, so that the immersion space LS is formed. As a result, as shown in FIG. 2, a state is created in which immersion exposure of the substrate P can be performed.

In the present embodiment, when the hold of the liquid LQ between itself on one side and the terminal optical element 10 and the immersion component 9 on the other side is switched from the cover component 13 to the substrate stage 2, that is, when the cover component 13 is extracted from between the terminal optical element 10 and the immersion component 9 on one side and the substrate stage 2 on the other side, the cover component 13 has a faster speed Vb than a speed Vs of the substrate stage 2. By employing this mode, during the operation to extract the cover component 13, any ingress of the liquid LQ to the area between the cover component 13 and the substrate stage 2 is prevented. For example, any ingress of the liquid LQ to the area between the cover component 13 and the substrate stage 2 is prevented by the surface tension of the liquid LQ. Accordingly, it is possible to prevent the liquid LQ adhering to or remaining on the bottom surface 27 of the cover component 13. As a result, it is possible to inhibit that the remaining liquid drops from the cover component 13 and adheres to the substrate stage 2 and the like.

Moreover, in the present embodiment, because the edges of the cover component 13 are formed at an acute angle (i.e., are sharp), during an operation to extract the cover component 13, it is possible to more effectively prevent any ingress of the liquid LQ to the area between the cover component 13 and the substrate stage 2, and to also more effectively prevent the liquid LQ becoming adhered to the bottom surface 27 of the cover component 13.

Moreover, in the present embodiment, the top surface 26 and bottom surface 27 of the cover component 13 are liquid-repellent towards the liquid LQ, and the top surface 23 of the substrate stage 2 is also liquid-repellent with respect to the liquid LQ. Therefore, during an operation to extract the cover component 13, it is possible to more effectively prevent any ingress of the liquid LQ to the area between the cover component 13 and the substrate stage 2, and to also more effectively prevent the liquid LQ becoming adhered to the bottom surface 27 of the cover component 13.

As described above, according to the present embodiment, it is possible to quickly switch from one of the cover component 13 and the substrate stage 2 to the other one for holding the liquid LQ between itself on one side and the terminal optical element 10 and the immersion component 9 on the other side. The substrate stage 2 and the cover component 13 are moved in a direction (the Y direction) parallel to the XY plane so that the hold of the liquid LQ between the substrate stage 2 (also known as an object, a movable object, and a mover) and a first member (i.e., at least one of the terminal optical element 10 and the immersion component 9) is switched to the hold of the liquid LQ between the cover component 13 (a second member) and the first member. As a result, the time can be reduced for switching between the cover component 13 and the substrate stage 2 to hold the liquid LQ between itself on one side and the first member on the other side. Accordingly, it is possible to suppress the deterioration of working rate of the exposure apparatus EX and to enhance the throughput. Furthermore, while the switching between the substrate stage 2 and the cover component 13, the relative speed between the substrate stage 2 and the cover component 13 is other than zero. As a result, any ingress of the liquid LQ to the area between the cover component 13 and the substrate stage 2 can be prevented while the switching. Furthermore, it is possible to prevent (discourage) the residual liquid from dropping from the cover component 13 and adhering to the substrate stage 2 and the like. Moreover, a space for holding the liquid LQ can continuously be formed between the terminal optical element 10 and the immersion component 9 on one side and at least one of the cover component 13 and the substrate stage 2 on the other side, and the operation of the liquid supply with the supply port 16 and the liquid recovery with the recovery port 17 can be continued; as a result, the immersion space LS can continuously be formed. If operations of the liquid supply with the supply port 16 and the liquid recovery with the recovery port 17 are halted, there is a possibility that re-forming of the immersion space LS requires considerable time, as a result, there is a possibility that throughput may be deteriorated. In the present embodiment, even if the substrate stage 2 is away from the first position A1, the immersion space LS can continuously be formed; as a result, it is possible to prevent any reduction in throughput.

In the present embodiment, the cover component 13 can move between the first position A1 and the second position A2 with no contact with the terminal optical element 10, the immersion component 9, and the substrate stage 2. As a result, for example, it is possible to prevent foreign matters from being produced by contacting components with each other.

In the present embodiment, the substrate switching process includes a first switching operation from the substrate stage 2 to the cover component 13 (i.e., the loading operation of the cover component 13) and a second switching operation from the cover component 13 to the substrate stage 2 (i.e., the unloading operation of the cover component 13). Alternatively, the first and the second switching operations can be executed for a process other than the substrate switching process, for example, for cleaning at least a part of the first member (e.g., the immersion component 9 and/or the terminal optical element 10). In this case, as described above, the liquid supply and the liquid recovery are concurrently executed. Therefore, the liquid LQ can be supplied to the area between the first member and the cover component 13, or a second liquid, which is different from the liquid LQ (a first liquid) and is a liquid for cleaning, such as a dissolved gas control liquid in which gas is dissolved, or an alkali cleaning liquid, can be used. In the latter case, it is preferable that the space between the first member and the cover component 13 be filled with the liquid LQ after the cleaning operation to form an immersion space.

The other embodiments of the present invention will now be described with reference made to the drawings. In the drawings, components the same as or similar to those shown in FIGS. 1 to 9 are denoted the same reference symbols, and description thereof is simplified or omitted.

Figure 10:
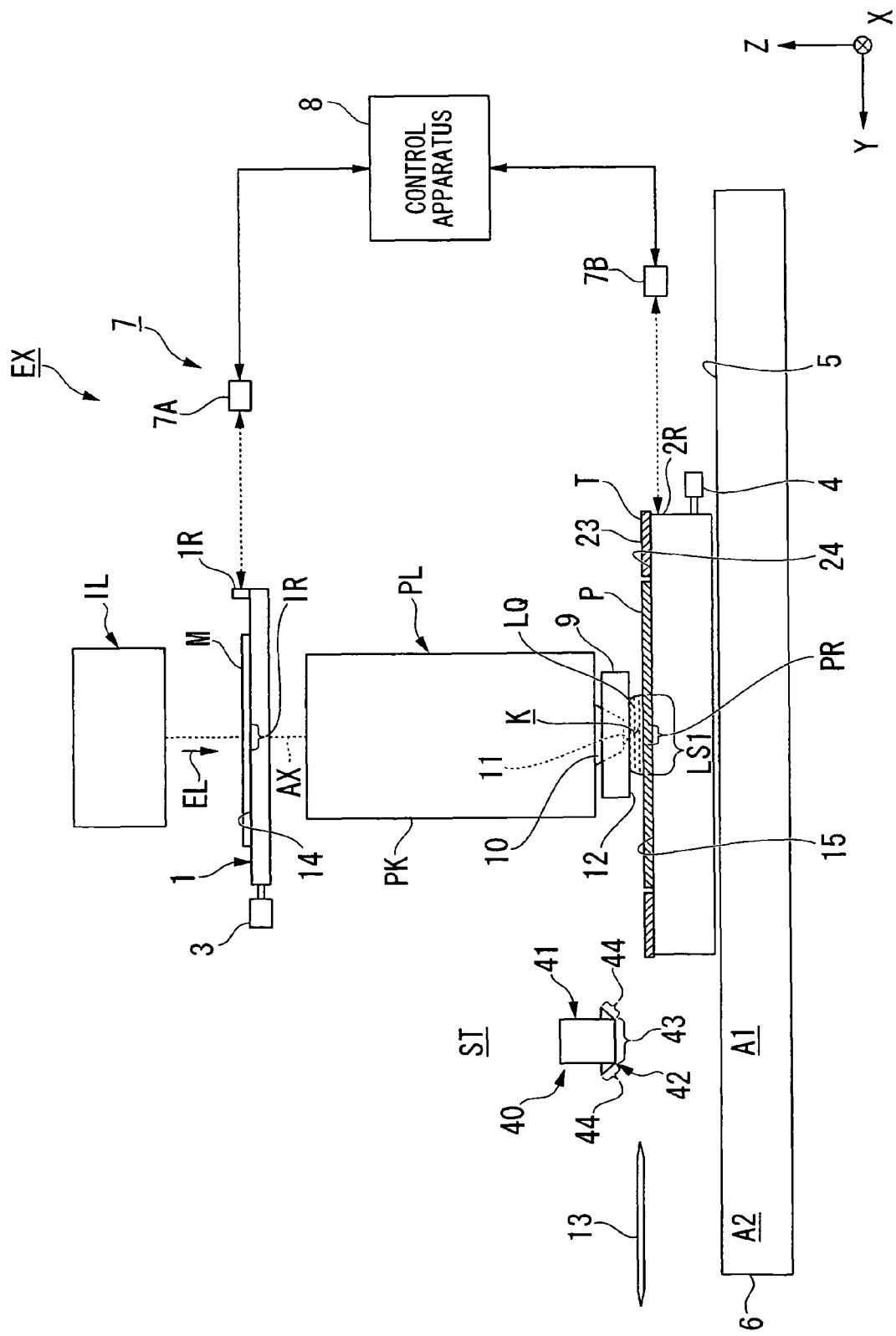
FIG. 10 is a schematic structural view showing an example of an exposure apparatus according to another embodiment.

FIG. 10 is a schematic structural view showing an example of an exposure apparatus EX according to the present embodiment.

In the present embodiment, the exposure apparatus EX is a liquid immersion exposure apparatus that exposes a substrate P using exposure light EL via an exposure liquid LQ. The exposure apparatus EX performs immersion exposure on the substrate P using the exposure liquid LQ. The exposure apparatus EX is provided with an immersion component 9 which is able to form an immersion space LS1 using the exposure liquid LQ such that at least a portion of an optical path K of the exposure light EL is filled by the exposure liquid LQ. The immersion space is a space which is filled with a liquid.

The exposure apparatus EX of the present embodiment is also provided with a cleaning apparatus 40 which cleans the surfaces of objects which come into contact with the exposure liquid LQ. The cleaning apparatus 40 is located on a cleaning station ST inside the exposure apparatus EX. In the present embodiment, the cleaning apparatus 40 cleans the surfaces of objects which come into contact with the exposure liquid LQ using a cleaning liquid LC. The cleaning apparatus 40 is provided with an immersion component 41 which is able to form an immersion space LS2 using the cleaning liquid LC between itself and a surface of an object.

In the description given below, the exposure liquid LQ is referred to where appropriate as a first liquid LQ, while the cleaning liquid LC is referred to where appropriate as a second liquid LC. In addition, the immersion space LS1 which is formed by the exposure liquid LQ is referred to where appropriate as a first immersion space LS1, while the immersion space LS2 which is formed by the cleaning liquid LC is referred to where appropriate as a second immersion space LS2. Furthermore, the immersion component 9 is referred to where appropriate as the first immersion component 9, while the immersion component 41 is referred to where appropriate as the second immersion component 41.

In the present embodiment, water (i.e., pure water) is used as the first liquid LQ, while a different liquid from the first liquid LQ is used for the second liquid LC. In the present embodiment, alkaline cleaning solution is used for the second liquid LC. Note that, as the second liquid LC, it is also possible to use dissolved gas control water obtained by dissolving a predetermined gas in water. The dissolved gas control water may be, for example, hydrogen water (i.e., hydrogen-dissolved water) obtained by dissolving hydrogen gas in water, ozone water (i.e., ozone-dissolved water) obtained by dissolving ozone gas in water, nitrogen water (i.e., nitrogen-dissolved water) obtained by dissolving nitrogen gas in water, argon water (i.e., argon-dissolved water) obtained by dissolving argon gas in water, and carbon dioxide water (i.e., carbon dioxide-dissolved water) obtained by dissolving carbon dioxide gas in water, and the like. Moreover, as the second liquid LC, it is also possible to use a chemical-added water obtained by adding a predetermined chemical liquid to water such as hydrogen peroxide water obtained by adding hydrogen peroxide to water, chlorine-added water obtained by adding hydrochloric acid (i.e., hypochlorous acid) to water, ammonia water obtained by adding ammonia to water, and sulfuric acid-added water obtained by adding sulfuric acid to water, and the like.

Furthermore, as the second liquid LC, it is also possible to use alcohols such as ethanol and methanol, ethers, gamma butyrolactone, thinners, surfactants, or fluorinated solvent such as HFE.

In the present embodiment, the first immersion space LS1 is formed such that the optical path K of the exposure light EL which is emitted from a terminal optical element 10, from among a plurality of optical elements of the projection optical system PL, which is closest to an image plane of the projection optical system PL is filled by the first liquid LQ. The terminal optical element 10 has an emission surface 11 which emits the exposure light EL towards the image plane of the projection optical system PL. The first immersion space LS1 is formed such that the optical path K between the terminal optical element 10 and an object which is placed at a position facing the emission surface 11 of this terminal optical element 10 is filled by the first liquid LQ. A position facing the emission surface 11 includes a position where the exposure light EL emitted from the emission surface 11 is irradiated.

The first immersion component 9 is placed in the vicinity of the terminal optical element 10. The first immersion component 9 has a bottom surface 12. In the present embodiment, an object which is able to face the emission surface 11 is able to face the bottom surface 12. When a surface of an object is placed at a position facing the emission surface 11, at least a portion of the bottom surface 12 faces the surface of the object. When the emission surface 11 and the surface of the object are facing each other, the terminal optical element 10 is able to hold the first liquid LQ between the emission surface 11 and the surface of the object. Moreover, when the bottom surface 12 and the surface of the object are facing each other, the first immersion component 9 is able to hold the first liquid LQ between the bottom surface 12 and the surface of the object. The first immersion space LS1 is formed by the first liquid LQ which is held between the emission surface 11 and bottom surface 12 and the surface of the object.

In the present embodiment, objects which are able to face the emission surface 11 and bottom surface 12 include objects which are able to move within a predetermined plane which includes the irradiation position of the exposure light EL emitted from the emission surface 11. In the present embodiment, these objects include at least one of the substrate stage 2 and a substrate P which is held on this substrate stage 2. In the present embodiment, the substrate stage 2 is able to move over the guide surface 5 of the base component 6. In the present embodiment, the guide surface 5 is substantially parallel with an XY plane. While holding a substrate P, the substrate stage 2 is able to move over the guide surface 5 within an XY plane which includes the irradiation position of the exposure light EL emitted from the emission surface 11.

In the present embodiment, the first immersion space LS1 is formed such that an area of a portion of the surface of the substrate P (i.e., a localized area) which is placed at a position facing the emission surface 11 and bottom surface 12 is covered by the first liquid LQ, and a boundary face of the liquid LQ (i.e., a meniscus or an edge) is formed between the surface of this substrate P and the bottom surface 12. Namely, in the present embodiment, when exposing a substrate P, the exposure apparatus EX employs a localized immersion method in which the first immersion space LS1 is formed such that the localized area of a portion of the substrate P which includes the projection area PR of the projection optical system PL is covered by the first liquid LQ.

The second immersion component 41 has a bottom surface 42 which is able to hold the second liquid LC between itself and a surface of a facing object, and is able to form a second immersion space LS2 between this bottom surface 42 and the facing object. The second immersion space LS2 is formed such that a localized area of a portion of the surface of the object is covered by the second liquid LC. In the present embodiment, the bottom surface 42 includes a first bottom surface 43, and a second bottom surface 44 which is located around the periphery of the first bottom surface 43.

The second immersion component 41 forms the second immersion space LS2 at a different position from the first immersion component 9. In the present embodiment, objects which are able to move to a position A1 facing the bottom surface 42 of the second immersion component 41 include objects which are able to move within a predetermined plane which includes the irradiation position of the exposure light EL emitted from the emission surface 11. Namely, such an object is an object which is able to form the first immersion space LS1 between itself and the first immersion component 9, and which comes into contact with the first liquid LQ. As a result of the second liquid LC being held between the bottom surface 42 of the second immersion component 41 and the object which is placed at the position A1 facing this bottom surface 42, the second immersion space LS2 is formed by this second liquid LC. In the present embodiment, objects which are able to move to the position A1 facing the bottom surface 42 include the substrate stage 2 which comes into contact with the first liquid LQ.

In the description given below, the position A1 which faces the bottom surface 42 of the second immersion component 41 is referred to where appropriate as the first position A1. In the present embodiment, the substrate stage 2 is able to move over the guide surface 5 within an XY plane which includes the irradiation position of the exposure light EL emitted from the emission surface 11, and also includes the first position A1 which faces the bottom surface 42.

Moreover, the exposure apparatus EX of the present embodiment is provided with a cover component 13 which is able to move to the first position A1. The cover component 13 is able to move between the second immersion component 41 and the substrate stage 2, and is able to form a space where the second liquid LC is held between itself and the second immersion component 41. The cover component 13 is able to face the bottom surface 42. In the present embodiment, the cover component 13 moves in a direction (i.e., the XY direction) which is substantially parallel with the guide surface 5. Moreover, the cover component 13 is able to move to a second position A2 which is different from the first position A1. The second position A2 includes positions which do not face the bottom surface 42. Namely, in the present embodiment, the cover component 13 is able to move within an XY plane which includes the first position A1 and the second position A2.

The second immersion component 41 is able to hold the second liquid LC and form the second immersion space LS2 between itself and the substrate stage 2 which is placed at the first position A1, and is able to hold the second liquid LC and form the second immersion space LS2 between itself and the cover component 13 which is placed at the first position A1.

In the present embodiment, the exposure apparatus EX is a scanning type of exposure apparatus (what is known as a scanning stepper) which projects an image of the pattern on the mask M onto the substrate P while moving the mask M and the substrate P in synchronization in predetermined scanning directions. When exposing a substrate P, the control apparatus 8 controls the mask stage 1 and the substrate stage 2 such that the mask M and the substrate P are moved in predetermined scanning directions within an XY plane which intersect with the optical path of the exposure light EL (i.e., the optical axis AX). In the present embodiment, the scanning direction of the substrate P (i.e., the synchronous movement direction) is taken as the Y axial direction, and the scanning direction of the mask M (i.e., the synchronous movement direction) is also taken as the Y axial direction. The control apparatus 8 moves the substrate P in the Y axial direction to the projection area PR of the projection optical system PL, and also moves the mask M in the Y axial direction to the illumination area IR of the illumination system IL in synchronization with this movement of the substrate P in the Y axial direction. At the same time as this, the control apparatus 8 irradiates the exposure light EL onto the substrate P via the projection optical system PL and the first liquid LQ in the first immersion space LS1 above the substrate P. As a result, the substrate P is exposed by the exposure light EL, and an image of the pattern on the mask M is projected onto the substrate P.

Figure 11:
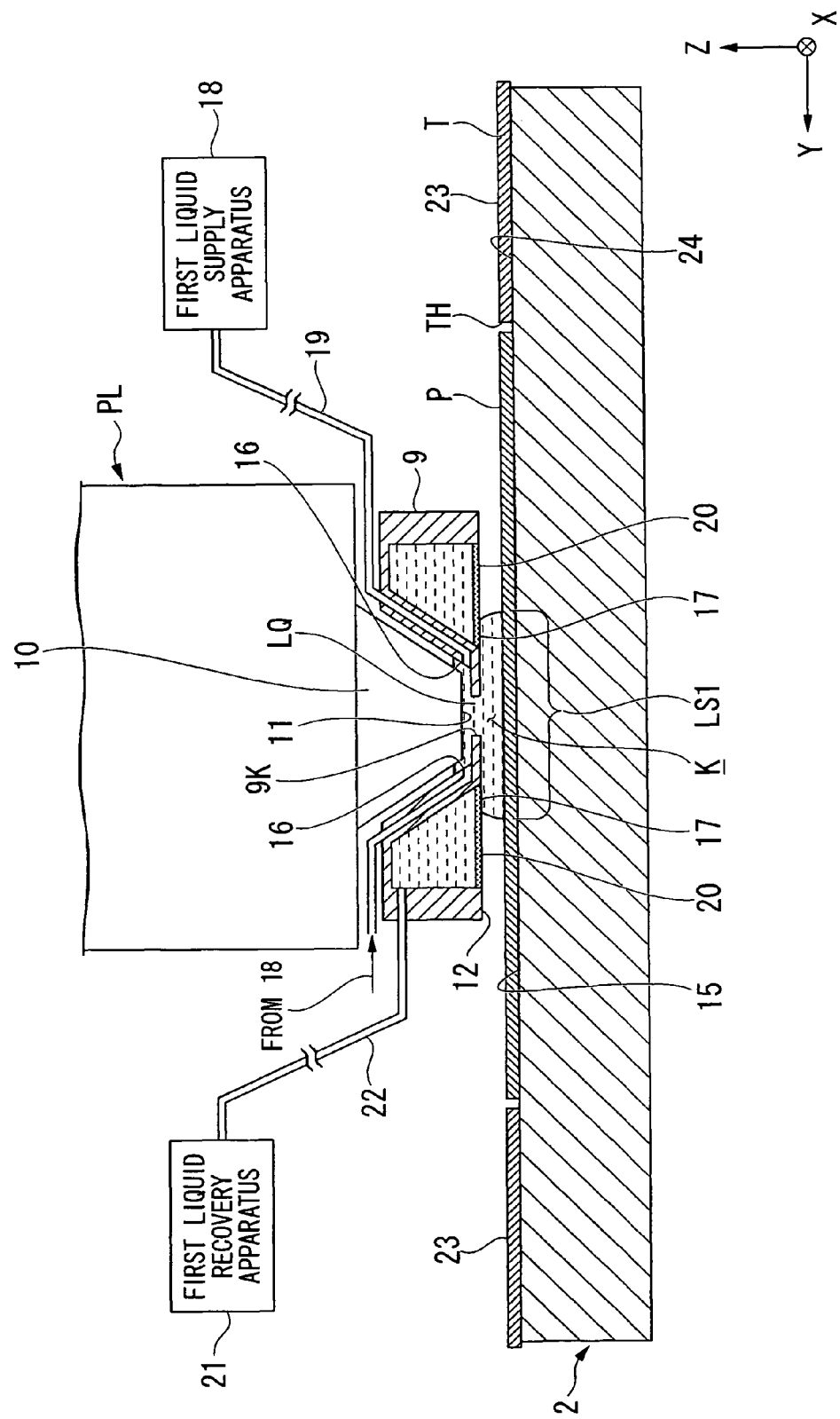
FIG. 11 is a side cross-sectional view showing a terminal optical element, a first immersion component, and a substrate stage.

FIG. 11 is a side cross-sectional view showing the vicinity of the terminal optical element 10, the first immersion component 9, and the substrate stage 2 which is placed at the first position A1. The first immersion component 9 is a member with a shaped annular. The first immersion component 9 is placed so as to surround the terminal optical element 10. The first immersion component 9 has an aperture 9K at a position facing the emission surface 11. The first immersion component 9 is provided with a supply aperture 16 which is able to supply the first liquid LQ, and a recovery aperture 17 which is able to recover the first liquid LQ.

The supply aperture 16 is able to supply the first liquid LQ to the optical path K of the exposure light EL in order to form the first immersion space LS1. The supply aperture 16 is located adjacent to the optical path K at a predetermined position of the first immersion component 9 facing this optical path K. In addition, the exposure apparatus EX is provided with a first liquid supply apparatus 18. The first liquid supply apparatus 18 is able to deliver first liquid LQ which has been purified and temperature-adjusted. The supply aperture 16 and the first liquid supply apparatus 18 are connected via a flow path 19.

The flow path 19 includes a supply flow path which is formed inside the first immersion component 9, and a flow path which is formed by a supply pipe which connects together this supply flow path and the first liquid supply apparatus 18. The first liquid LQ which is delivered from the first liquid supply apparatus 18 is supplied to the supply aperture 16 via the flow path 19. The supply aperture 16 supplies the liquid LQ from the first liquid supply apparatus 18 to the optical path K of the exposure light EL.

The recovery aperture 17 is able to recover at least a portion of the liquid LQ above an object which is facing the bottom surface 12 of the first immersion component 9. In the present embodiment, the recovery aperture 17 is located peripherally to the optical path K of the exposure light EL. The recovery aperture 17 is placed at a predetermined position of the first immersion component 9 facing a surface of an object. A plate-shaped porous component 20 which includes a plurality of pores is placed in the recovery aperture 17. Note that a mesh filter which is a porous component in which a large number of small pores are formed in a mesh shape may be placed in the recovery aperture 17. In the present embodiment, at least a portion of the bottom surface 12 of the first immersion component 9 is formed by a bottom surface of the porous component 20. The exposure apparatus EX is also provided with a first liquid recovery apparatus 21 which is able to recover the first liquid LQ. The first liquid recovery apparatus 21 includes a vacuum system, and is able to recover the first liquid LQ by suction. The recovery aperture 17 and the first liquid recovery apparatus 21 are connected via a flow path 22. The flow path 22 includes a recovery flow path which is formed inside the first immersion component 9, and a flow path which is formed by a recovery pipe which connects together this recovery flow path and the first liquid recovery apparatus 21. The first liquid LQ which is recovered via the recovery aperture 17 is returned to the first liquid recovery apparatus 21 through the flow path 22.

In the present embodiment, the control apparatus 8 executes a liquid supply operation which employs the supply aperture 16 in parallel with the liquid recovery operation which employs the recovery aperture 17. As a result, it is possible to form the first immersion space LS1 using the first liquid LQ between the terminal optical element 10 and first immersion component 9 and the object which is facing the terminal optical element 10 and first immersion component 9.

Also in the present embodiment, the top surface 23 of the substrate stage 2 includes the top surface of the plate component T which is being held on the plate component holding portion 24.

In the present embodiment, the top surface 23 of the substrate stage 2 has liquid-repellency with respect to the first liquid LQ. Moreover, in the present embodiment, the top surface 23 of the substrate stage 2 has liquid repellency with respect to the second liquid LC. In the present embodiment, the top surface 23 is formed from a liquid-repellent material such as, for example, PFA (i.e., a tetra fluoro ethylene-perfluoro alkylvinyl ether copolymer), PTFE (poly tetra fluoro ethylene), Teflon (registered trade name) and the like. In the present embodiment, the contact angle of the top surface 23 relative to the first and second liquids LQ and LC is, for example, 90° or more.

Figure 12:
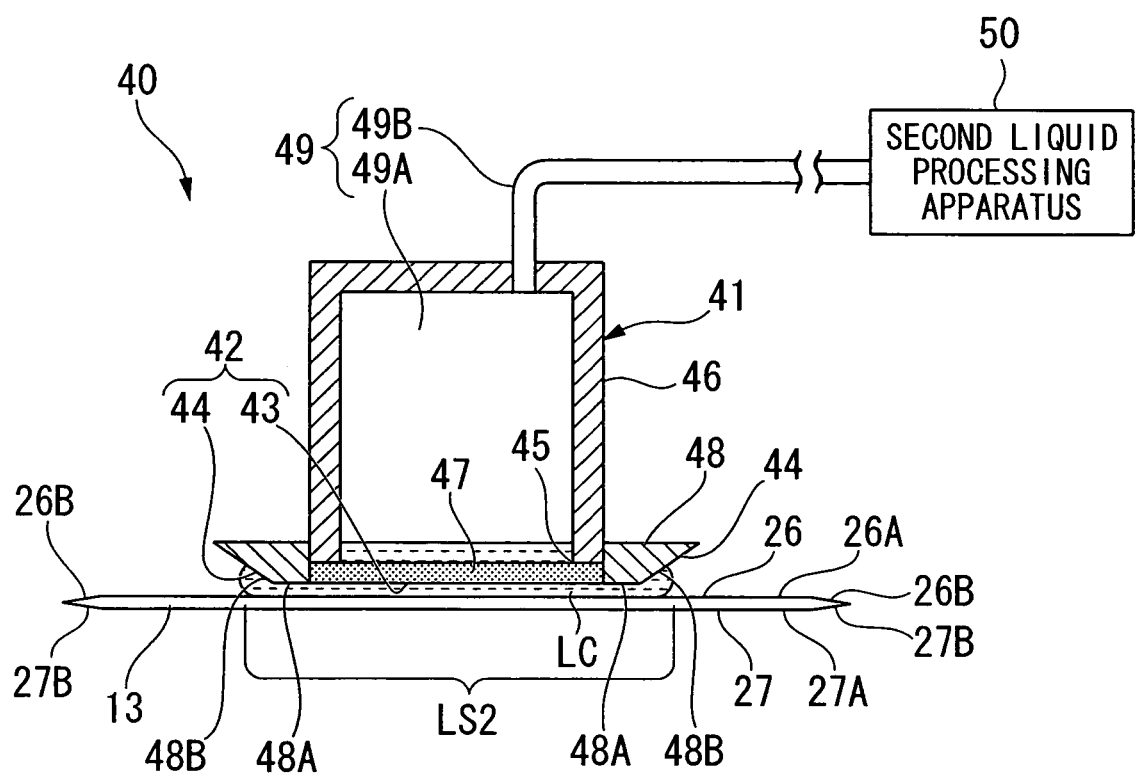
FIG. 12 is a side cross-sectional view showing a terminal optical element, a second immersion component, and a cover component which has been placed at a first position.
Figure 13:
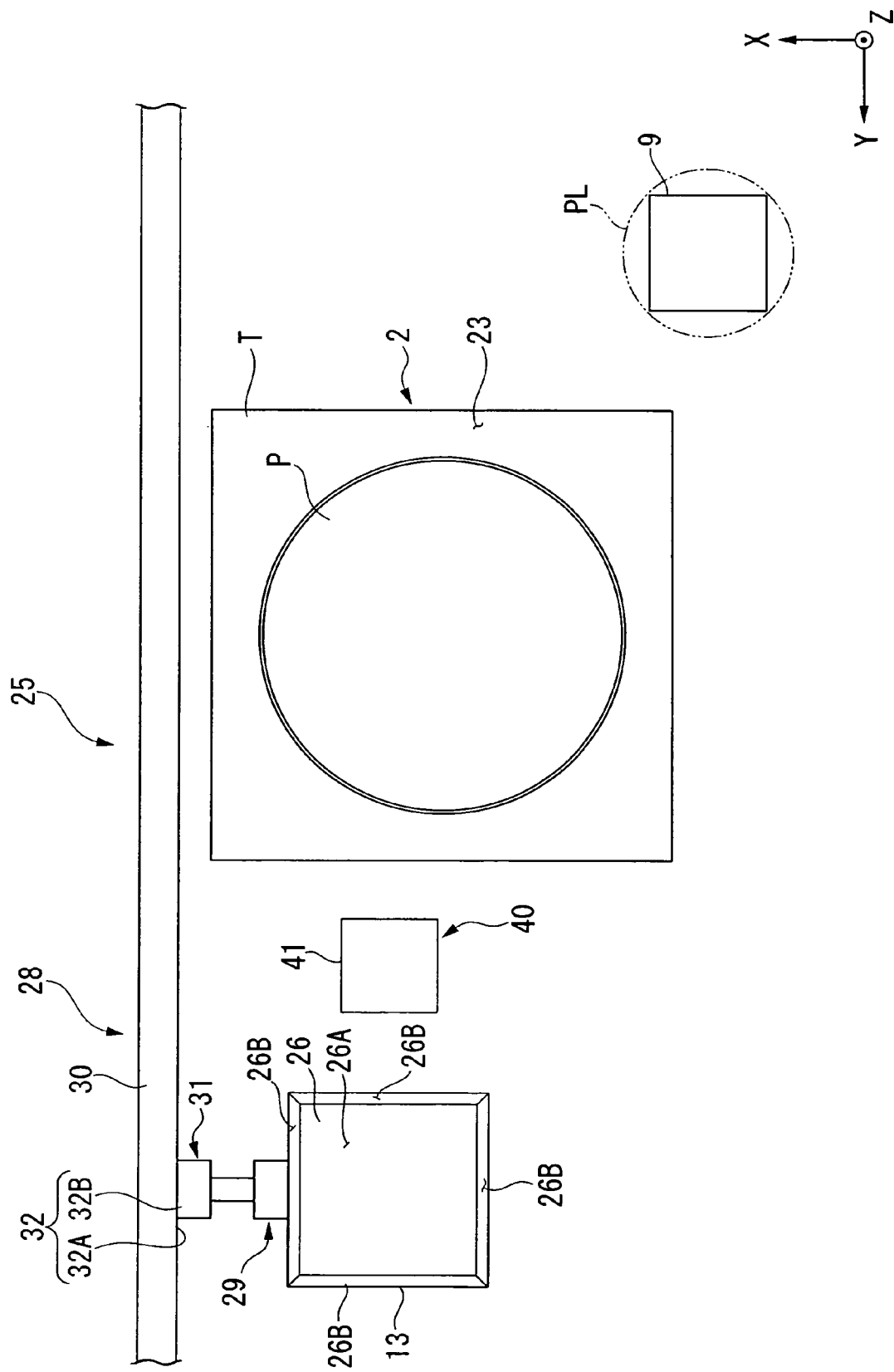
FIG. 13 is a plain view showing a cover component and a third drive system which moves the cover component.

FIG. 12 is a side cross-sectional view showing the vicinity of the second immersion component 41, and the cover component 13 which is located at the first position A1. FIG. 13 is a plan view intended to illustrate the cover component 13 and a third drive system 25 which movably supports the cover component 13. In the description given below which employs FIG. 12 and FIG. 13, the description centers on a case in which the second liquid LC is held between the second immersion component 41 and the cover component 13, however, as is described above, the second liquid LC can be held between the second immersion component 41 and the substrate stage 2.

As is shown in FIG. 12 and FIG. 13, the cover component 13 is a plate-shaped component, and is able to hold the second liquid LC and form the second immersion space LS2 between itself and the second immersion component 41. The cover component 13 is able to move in the XY direction between the bottom surface 42 of the second immersion component 41 and the top surface 23 of the substrate stage 2 which is located at the first position A1. The cover component 13 has a top surface 26 which is able to face the bottom surface 42 and a bottom surface 27 which is able to face the top surface 23 of the substrate stage 2. The top surface 26 includes a level area 26A and a sloping area 26B. The level area 26A is the larger portion and includes the center of the top surface 26, and is substantially parallel with an XY plane. The sloping area 26B is the edge area of the top surface 26, and is inclined so as to gradually approach the bottom surface 27 moving in a radial direction from the center of the top surface 26. The bottom surface 27 includes a level area 27A and a sloping area 27B. The level area 27A is the majority portion and includes the center of the bottom surface 27, and is substantially parallel with the XY plane. The sloping area 27B is the edge area of the bottom surface 27, and is inclined so as to gradually approach the top surface 26 moving in a radial direction from the center of the bottom surface 27. The angle formed by the sloping area 26B of the top surface 26 and the sloping area 27B of the bottom surface 27 is an acute angle. Namely, in the present embodiment, the edges of the cover component 13 have an acute angle.

In the present embodiment, the top surface 26 and the bottom surface 27 of the cover component 13 have liquid-repellency to the second liquid LC. In the present embodiment, the cover component 13 includes a base material made, for example, from a metal such as stainless steel and the like, and a film of liquid-repellent material which is formed on the surface of this base material. The liquid-repellent material may be, for example, PFA, PTFE, Teflon (registered trade name), and the like. Note that the material used to form the film may also be an acrylic-based resin, or a silicon-based resin. Moreover, it is also possible for the entire cover component 13 to be formed from at least one of PFA, PTFE, Teflon (registered trade name), an acrylic-based resin, or a silicon-based resin. In the present embodiment, the contact angles of the top surface 26 and the bottom surface 27 of the cover component 13 relative to the second liquid LC maybe, for example, 90° or more.

As is shown in FIG. 12, the second immersion component 41 includes a first component 46 in which an aperture 45 is formed, a porous component 47 which is placed in the aperture 45, and a second component 48 which is placed around the periphery of the first component 46. The aperture 45 is placed at a predetermined position of the first component 46 so as to face the top surface 26 of the cover component 13. The first component 46 and the second component 48 may be formed from a metal such as, for example, stainless steel, titanium, or the like.

The porous component 47 is positioned so as to cover the aperture 45. The porous component 47 is a plate-shaped component which includes a plurality of pores (or openings). Note that a mesh filter which is a porous component in which a large number of small pores are formed in a mesh shape may also be placed in the aperture 45. In the present embodiment, a bottom surface of the porous component 47 which is able to face the top surface 26 of the cover component 13 is substantially parallel with the XY plane.

The second component 48 includes a level area 48A which is substantially parallel with the XY plane, and a sloping area 48B which is inclined relative to the level surface 48A. The level surface 48A and the sloping surface 48B are able to face the top surface 26 of the cover component 13. The sloping surface 48B is further than the level surface 48A from the top surface 26. The level surface 48A is placed around the periphery of the bottom surface of the porous component 47. The bottom surface of the porous component 47 and the level surface 48A are placed within substantially the same plane (i.e., within the XY plane). Namely, the bottom surface of the porous component 47 and the level surface 48A are substantially flush with each other. The sloping surface 48B is placed around the periphery of the level surface 48A.

The bottom surface 42 of the second immersion component 41 is able to hold the second liquid LC between itself and the top surface 26 of the cover component 13. In the present embodiment, the bottom surface 42 of the second immersion component 41 is formed by the bottom surface of the porous component 47, and the level surface 48A and the sloping surface 48B of the second component 48.

The bottom surface 42 includes a first bottom surface 43 which is able to hold the second liquid LC between itself and the top surface 26, and a second bottom surface 44 which is placed around the periphery of the first bottom surface 43, and which is further than the first bottom surface 43 from the top surface 26 of the cover component 13. The first bottom surface 43 is substantially parallel with the top surface 26 of the cover component 13. Namely, the first bottom surface 43 is substantially parallel with the XY plane.

In the present embodiment, the first bottom surface 43 includes the bottom surface of the porous component 47, and the level surface 48A of the second component 48 which is placed around the periphery of the bottom surface of the porous component 47. The second bottom surface 44 includes the sloping surface 48B of the second component 48. The second bottom surface 44 is inclined such that the distance between itself and the top surface 26 of the cover component 13 becomes gradually larger in a direction in which it moves away from the center of the first bottom surface 43.

In the present embodiment, the second bottom surface 44 has liquid-repellency towards the second liquid LC. In the present embodiment, the second bottom surface 44 is formed from a material (i.e., from a liquid repellent material) which has liquid-repellency towards the second liquid LC. This liquid-repellent material may be, for example, PFA, PTFE, Teflon (registered trade name) or the like. In the present embodiment, the contact angle of the second bottom surface 44 relative to the second liquid LC is, for example, 90° or more.

The second component 41 has an internal flow path 49A which communicates with the aperture 45. The internal flow path 49A is connected with a second liquid processing apparatus 50 via a flow path 49B which is formed by a pipe. The second liquid processing apparatus 50 is able to deliver the second liquid LC. In addition, the second liquid processing apparatus 50 is able to recover the second liquid LC by suction. Namely, in the present embodiment, the second liquid processing apparatus 50 has the function of supplying the second liquid LC, and the function of recovering the second liquid LC.

The aperture 45 and the second liquid processing apparatus 50 are connected via the flow path 49 which includes the internal flow path 49A and the flow path 49B. The second liquid LC which is delivered from the second liquid processing apparatus 50 is supplied to the aperture 45 via the flow path 49. The second liquid LC which is supplied to the aperture 45 is supplied to a portion between the first bottom surface 43 and the top surface 26 of the cover component 13 via the porous component 47 (i.e., via the pores in the porous component 47). As a result, the second immersion space LS2 is formed by the second liquid LC between the first bottom surface 43 and the top surface 26. Moreover, in the present embodiment, a portion of the second liquid LC of the second immersion space LS2 is held between the second bottom surface 44 and the top surface 26.

Moreover, as a result of the second liquid processing apparatus 50 executing a recovery operation, the second liquid LC between the first bottom surface 43 and the top surface 26 of the cover component 13 is recovered via the porous component 47 (i.e., via the pores in the porous component 47). The second liquid LC which flows into the internal flow path 49A via the porous component 47 is recovered to the second liquid processing apparatus 50 via the flow path 49B.

In the present embodiment, when the substrate stage 2 has been separated from the second immersion component 41, the cover component 13 is located at the first position A1. For example, when the substrate stage 2 moves to a position facing the emission surface 11 of the terminal optical element 10, or when it moves to a substrate switching position, the cover component 13 is located at the first position A1 and is able to hold the second liquid LC and form the second immersion space LS2 between itself and the second immersion component 41. Note that the substrate switching position is a position separated from the terminal optical element 10, the first immersion component 9, and the second immersion component 41, namely, a position which does not face the emission surface 11, the bottom surface 12, and the bottom surface 42, and includes a loading position where an operation to load a substrate P onto the substrate stage 2 prior to its exposure is executed, and an unloading position where an operation to transport a substrate P away from the substrate stage 2 after its exposure is executed.

Moreover, when the substrate stage 2 is located at the first position A1, the cover component 13 is able to move to a second position A2 which does not face the bottom surface 42. For example, when the substrate stage 2 is being cleaned, the control apparatus 8 cleans the substrate stage 2 while the cover component 13 is placed at the second position A2 which does not face the bottom surface 42.

As is shown in FIG. 11, in the present embodiment, the substrate stage 2 is able to form a space to hold the first liquid LQ between the terminal optical element 10 and the first immersion component 9 and facing the emission surface 11 and bottom surface 12, and thereby form the first immersion space LS1. In addition, the substrate stage 2 is able to form a space to hold the second liquid LC between itself and the second immersion component 41 and facing the bottom surface 42, and thereby form the second immersion space LS2.

Moreover, as is shown in FIG. 12, the cover component 13 is able to form a space to hold the second liquid LC between itself and the second immersion component 41 and facing the bottom surface 42, and thereby form the second immersion space LS2. In the present embodiment, the control apparatus 8 places at least one of the cover component 13 and the substrate stage 2 at the first position A1, and is able to continuously form a space to hold the second liquid LC between the second immersion component 41 and at least one of the cover component 13 and the substrate stage 2. The control apparatus 8 controls the second drive system 4 and the third drive system 25, and using the relative movement in the XY direction between the cover component 13 and the substrate stage 2, is able to switch the hold of the second liquid LC from the second immersion component 41 and the one of the cover component 13 and substrate stage 2 to the second immersion component 41 and the other of the cover component 13 and substrate stage 2.

Moreover, in the present embodiment, the control apparatus 8 controls the third drive system 25 such that the cover component 13 can be inserted between the second immersion component 41 and the substrate stage 2 which has been placed at the first position A1, and such that the cover component 13 can be extracted from between the second immersion component 41 and the substrate stage 2 which is placed at the first position A1. The control apparatus 8 executes at least one of an operation to insert the cover component 13 and an operation to extract the cover component 13 in order to switch the hold of the second liquid LC from the second immersion component 41 and the one of the cover component 13 and substrate stage 2 to the second immersion component 41 and the other of the cover component 13 and substrate stage 2.

Next, a description will be given of an example of an operation of the exposure apparatus EX having the above described structure. In order to perform immersion exposure of the substrate P which is being held on the substrate stage 2, the control apparatus 8 forms the first immersion space LS1 between the terminal optical element 10 and first immersion component 9 and the substrate stage 2 which has been placed at the irradiation position of the exposure light EL. The control apparatus 8 then emits the exposure light EL using the illumination system IL in order to expose the substrate P. The exposure light EL which has been emitted from the illumination system IL illuminates a mask M. The exposure light EL which has passed through the mask M is irradiated onto the substrate P via the projection optical system PL and the first liquid LQ in the first immersion space LS1. As a result, an image of the pattern on the mask M is projected onto the substrate P, and the substrate P is exposed by the exposure light EL. During the exposure of the substrate P, the first liquid LQ in the first immersion space LS1 is in contact with the top surface 23 of the substrate stage 2.

At a predetermined timing, the control apparatus 8 executes an operation to clean the top surface 23 of the substrate stage 2. In order to clean the top surface 23 of the substrate stage 2, the control apparatus 8 moves the substrate stage 2 to a cleaning station ST.

Note that when the top surface 23 of the substrate stage 2 is being cleaned, it is possible for a dummy substrate to be held in the substrate holding portion 15. A dummy substrate is a (clean) component which is different from the exposure substrate P and which has a high degree of cleanliness so as not to impart any contamination. The dummy substrate has substantially the same outer shape as the substrate P, and the substrate holding portion 15 is able to hold this dummy substrate.

The dummy substrate can be used for preventing the liquid ingression and the like, therefore, the dummy substrate can be termed a cover member, a lid member, a protection member or the like.

The control apparatus 8 firstly places the cover component 13 at the first position A1 in order to clean the top surface 23 of the substrate stage 2. Next, the control apparatus 8 operates the second liquid processing apparatus 50 so that the second liquid LC is supplied. The second liquid LC is supplied via the porous component 47 to an area between the first bottom surface 43 of the second immersion component 41 and the top surface 26 of the cover component 13. The second liquid LC is supplied by means of the first bottom surface 43. A predetermined quantity of the second liquid LC is supplied, and after the second immersion space LS2 has been formed, the control apparatus 8 stops the operation to supply the second liquid LC.

Next, the control apparatus 8 starts an operation to switch the hold of the second liquid LC from between the second immersion component 41 and the cover component 13 to between the second immersion component 41 and the substrate stage 2.

The control apparatus 8 moves the substrate stage 2 to the first position A1 while the second liquid LC is being held between the second immersion component 41 and the cover component 13. Namely, the control apparatus 8 moves the substrate stage 2 to a position where it faces at least a portion of the bottom surface 27 of the cover component 13 which is holding the second liquid LC between itself and the second immersion component 41. As a result, the cover component 13 is placed between the second immersion component 41 and the substrate stage 2.

In order to switch the hold of the second liquid LC from between the second immersion component 41 and the cover component 13 to between the second immersion component 41 and the substrate stage 2, in a state in which the second immersion space LS2 has been formed, the control apparatus 8 starts an operation to extract the cover component 13 from between the second immersion component 41 and the substrate stage 2.

Figure 14:
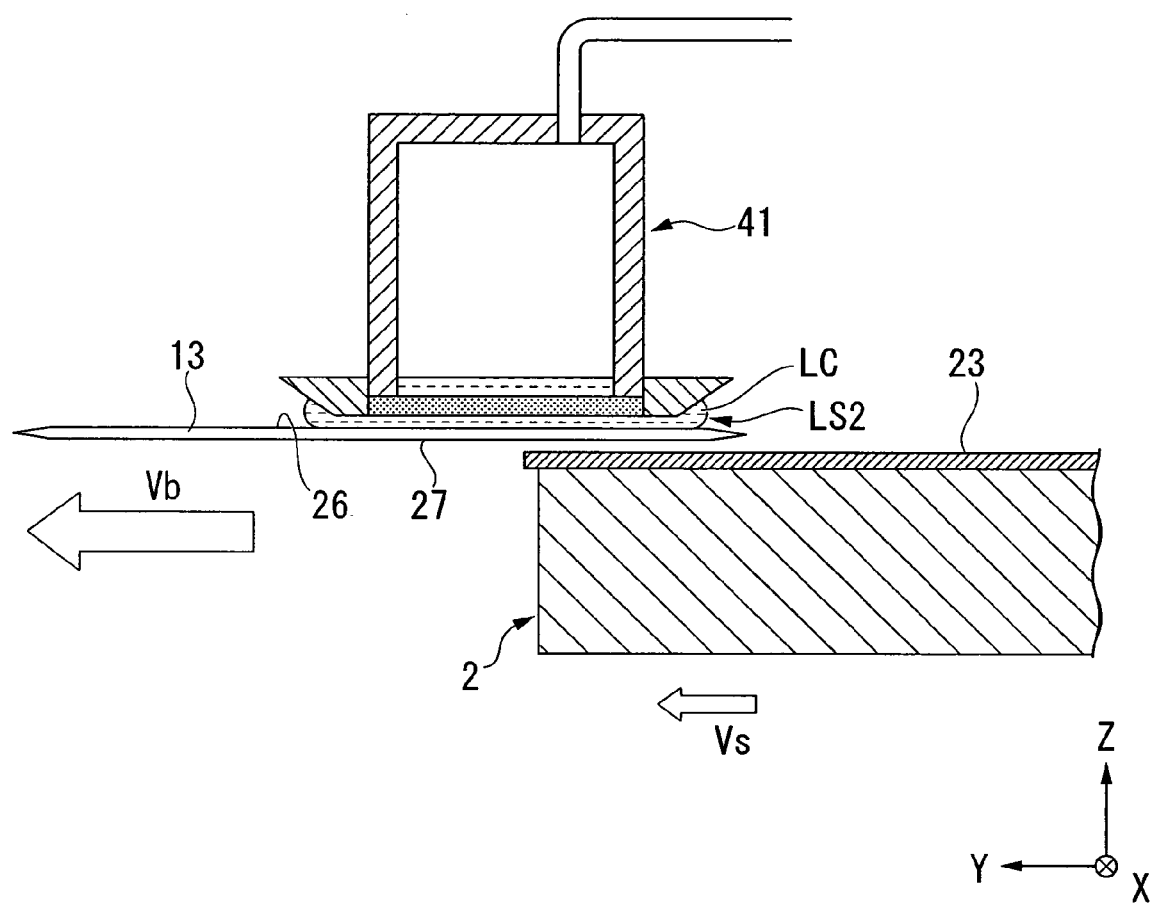
FIG. 14 is a typical view used to illustrate an example of an operation of the exposure apparatus.
Figure 15:
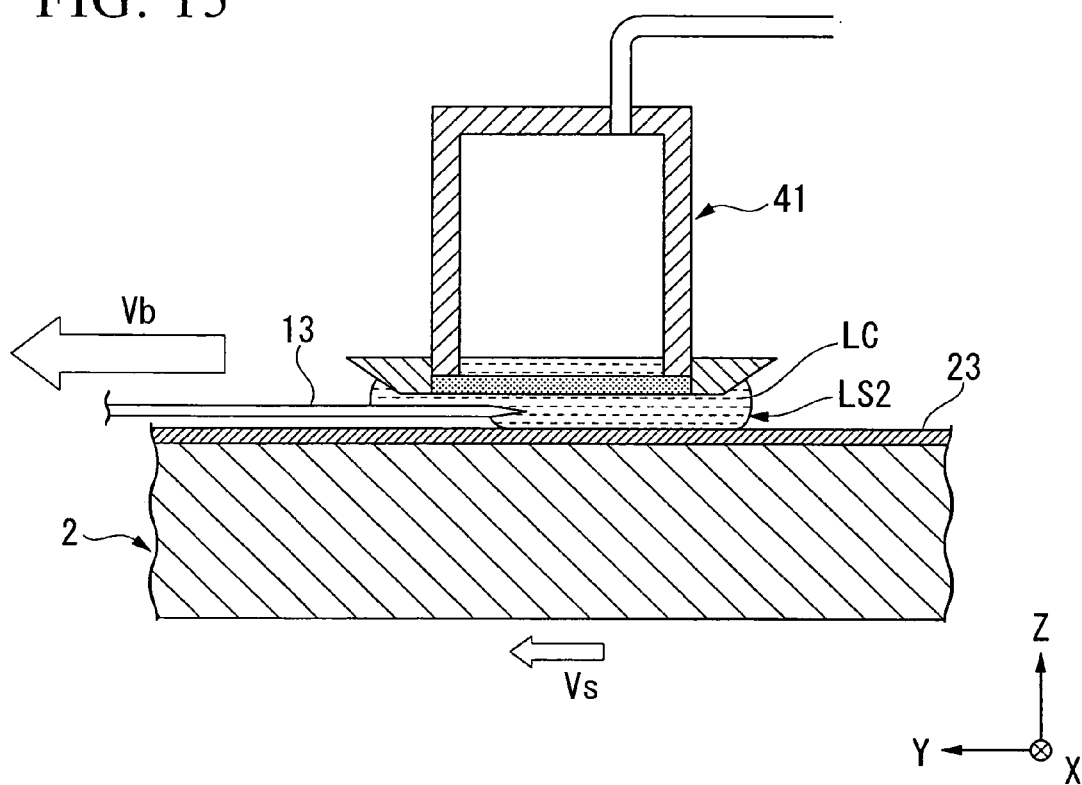
FIG. 15 is a typical view used to illustrate an example of an operation of the exposure apparatus.

A description will now be given of an example of an operation to switch the hold of the second liquid LC from between the second immersion component 41 and the cover component 13 to between the second immersion component 41 and the substrate stage 2 with reference made to the typical views in FIG. 14 and FIG. 15.

In the present embodiment, when performing this switching, the control apparatus 8 moves the cover component 13 and the substrate stage 2 essentially in the same direction. In the present embodiment, as an example, a case is described in which the cover component 13 and the substrate stage 2 are each moved in the +Y direction.

Moreover, in the present embodiment, during the switching, the control apparatus 8 moves the cover component 13 and the substrate stage 2 independently at different speeds. The control apparatus 8 moves the cover component 13 in the +Y direction at a speed Vb, and moves the substrate stage 2 in the +Y direction at a speed Vs. In the present embodiment, when the hold of the second liquid LC is switched from between the second immersion component 41 and the cover component 13 to between the second immersion component 41 and the substrate stage 2, the cover component 13 is moved at a faster speed than the substrate stage 2.

The control apparatus 8 extracts the cover component 13 which is located at the first position A1 from between the second immersion component 41 and the substrate stage 2 such that it is moved to the second position A2. In the present embodiment, the second position A2 is a position on the +Y side of the first position A1. The control apparatus 8 moves the cover component 13 in the +Y direction in synchronization with the movement of the substrate stage 2 in the +Y direction so that the cover component 13 is extracted from between the second immersion component 41 and the substrate stage 2. The control apparatus 8 extracts the cover component 13 while the second liquid LC is in a state of being held between the second immersion component 41 and the cover component 13.

When the cover component 13 is being extracted, the control apparatus 8 moves the cover component 13 at the speed Vb which is faster than the speed Vs of the substrate stage 2. As a result of the substrate stage 2 being moved in the +Y direction and the cover component 13 being moved in the +Y direction, the second liquid LC changes from the state shown in FIG. 14 to the state shown in FIG. 15.

After the cover component 13 has moved to the second position A2 and the operation to extract the cover component 13 has ended, the second liquid LC is held between the second immersion component 41 and the substrate stage 2 which is placed at the first position A1, so that the second immersion space LS2 is formed. As a result, a state is created in which cleaning of the top surface 23 of the substrate stage 2 can be performed.

In the present embodiment, when the hold of the second liquid LC is switched from between the second immersion component 41 and the cover component 13 to between the second immersion component 41 and the substrate stage 2, namely, when the cover component 13 is extracted from between the second immersion component 41 and the substrate stage 2, the speed Vb of the cover component 13 is faster than the speed Vs of the substrate stage 2. By employing this mode, during the operation to extract the cover component 13, any ingress of the second liquid LC to the area between the cover component 13 and the substrate stage 2 is prevented. For example, any ingress of the second liquid LC to the area between the cover component 13 and the substrate stage 2 is prevented by the surface tension of the second liquid LC. Accordingly, it is possible to prevent the second liquid LC adhering to or remaining on the bottom surface 27 of the cover component 13.

Moreover, in the present embodiment, because the edges of the cover component 13 are formed at an acute angle (i.e., are sharp), during an operation to extract the cover component 13, it is possible to more effectively prevent any ingress of the second liquid LC to the area between the cover component 13 and the substrate stage 2, and to also more effectively prevent the second liquid LC becoming adhered to the bottom surface 27 of the cover component 13.

Moreover, in the present embodiment, the top surface 26 and bottom surface 27 of the cover component 13 are liquid-repellent towards the second liquid LC, and the top surface 23 of the substrate stage 2 is also liquid-repellent with respect to the second liquid LC. Accordingly, in an operation to extract the cover component 13, any ingress of the second liquid LC to the area between the cover component 13 and the substrate stage 2, and any adhesion of the second liquid LC to the bottom surface 27 of the cover component 13 are more effectively prevented.

Figure 16:
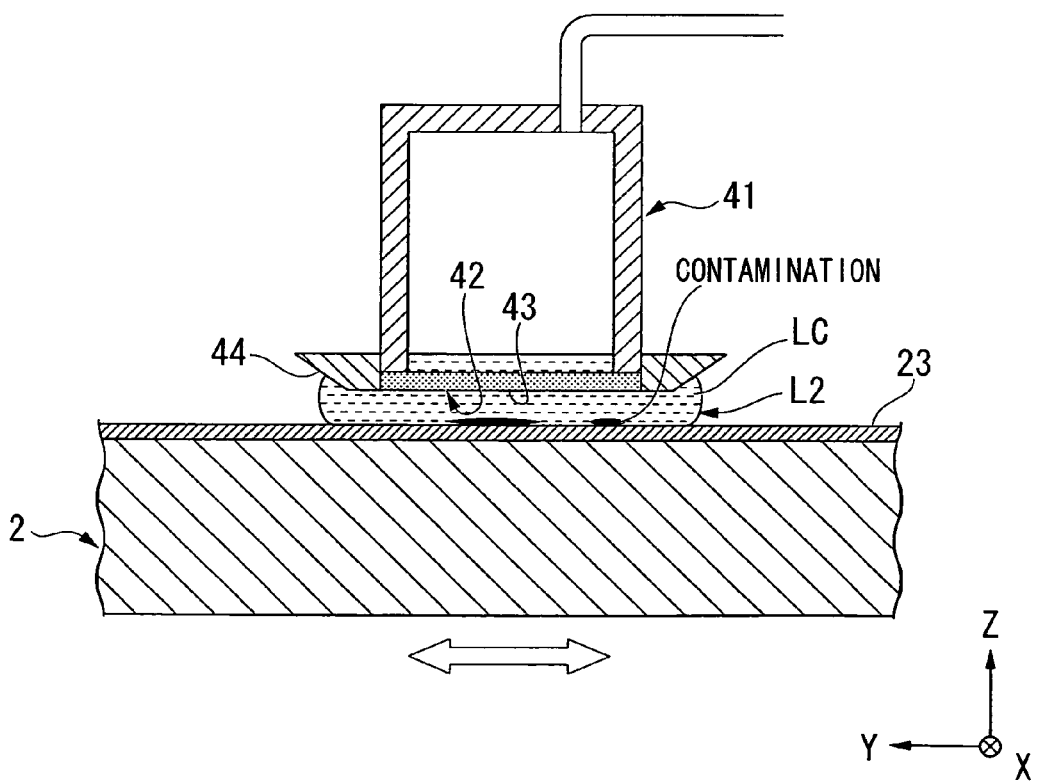
FIG. 16 is a typical view used to illustrate an example of an operation of the exposure apparatus.

FIG. 16 shows a state in which the top surface 23 of the substrate stage 2 is being cleaned using the second liquid LC. After the second immersion space LS2 has been formed between the second immersion component 41 and the substrate stage 2, in order to clean the top surface 23 of the substrate stage 2, while the second liquid LC is in a state of being held between the first bottom surface 43 of the second immersion component 41 and the top surface 23 of the substrate stage 2, the control apparatus 8 moves the first bottom surface 43 and the top surface 23 relatively to each other. As is shown in FIG. 16, in the present embodiment, the control apparatus 8 controls the second drive system 4 such that the top surface 23 of the substrate stage 2 is moved in the XY direction relative to the first bottom surface 43. As a result, the top surface 23 is cleaned superbly.

In the present embodiment, because the second immersion component 41 has the second bottom surface 44, even if the substrate stage 2 is moved in the XY direction when the second immersion space LS2 has already been formed, any increase in the size of the second immersion space LS2 within the XY plane, or any outflow of the second liquid LC from between the bottom surface 42 and the top surface 23 is prevented.

While the substrate stage 2 is being cleaned, the cover component 13 is placed at the second position A2 which does not face the bottom surface 42.

After the cleaning of the substrate stage 2 has ended, the control apparatus 8 starts an operation to switch the hold of the second liquid LC from between the second immersion component 41 and the substrate stage 2 to between the second immersion component 41 and the cover component 13. In order to switch the hold of the second liquid LC from between the second immersion component 41 and the substrate stage 2 to between the second immersion component 41 and the cover component 13, the control apparatus 8 starts an operation to insert the cover component 13 between the second immersion component 41 and the substrate stage 2 in a state in which the second immersion space LS2 has been formed.

A description will now be given of an example of an operation to switch the hold of the second liquid LC from between the second immersion component 41 and the substrate stage 2 to between the second immersion component 41 and the cover component 13 with reference made to the typical views in FIG. 17 and FIG. 18.

In the present embodiment, when performing this switching, the control apparatus 8 moves the cover component 13 and the substrate stage 2 essentially in the same direction. In the present embodiment, as an example, a case is described in which the cover component 13 and the substrate stage 2 are each moved in the −Y direction.

Moreover, in the present embodiment, during the switching, the control apparatus 8 moves the cover component 13 and the substrate stage 2 independently at different speeds. The control apparatus 8 moves the cover component 13 in the −Y direction at a speed Vb, and moves the substrate stage 2 in the −Y direction at a speed Vs. In the present embodiment, when the hold of the second liquid LC is being switched from between the second immersion component 41 and the cover component 13 to between the second immersion component 41 and the substrate stage 2, the substrate stage 2 is moved at a faster speed than the cover component 13.

Figure 17:
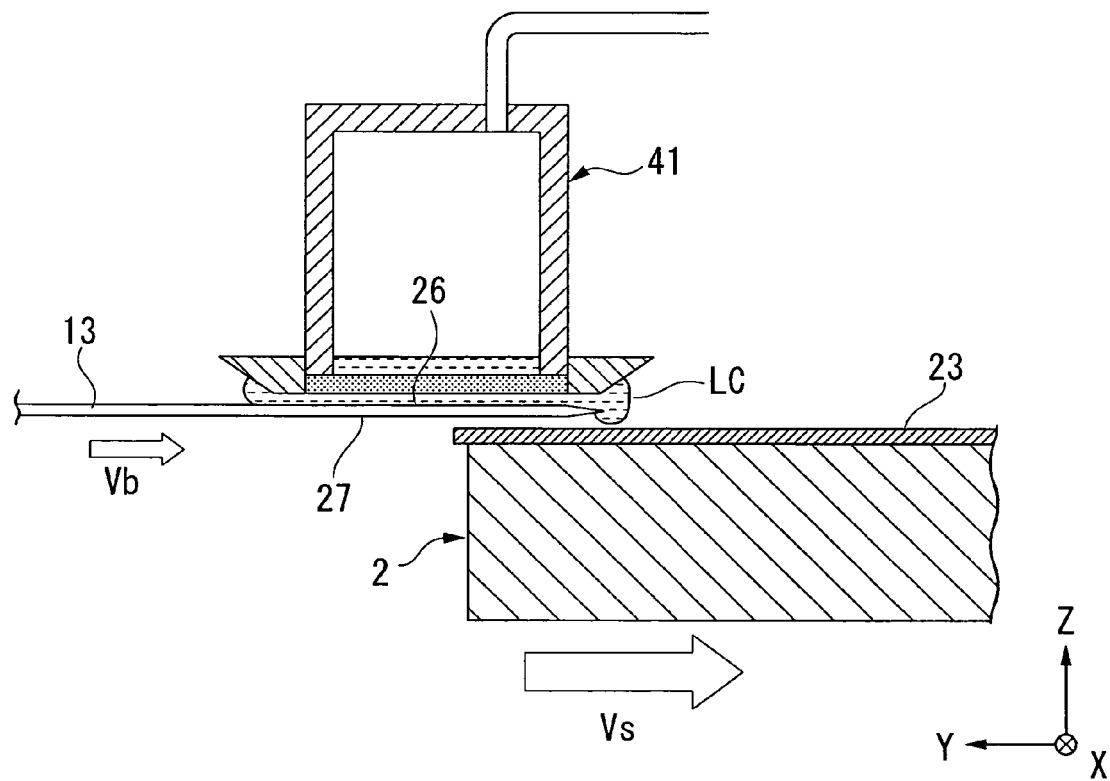
FIG. 17 is a typical view used to illustrate an example of an operation of the exposure apparatus.
Figure 18:
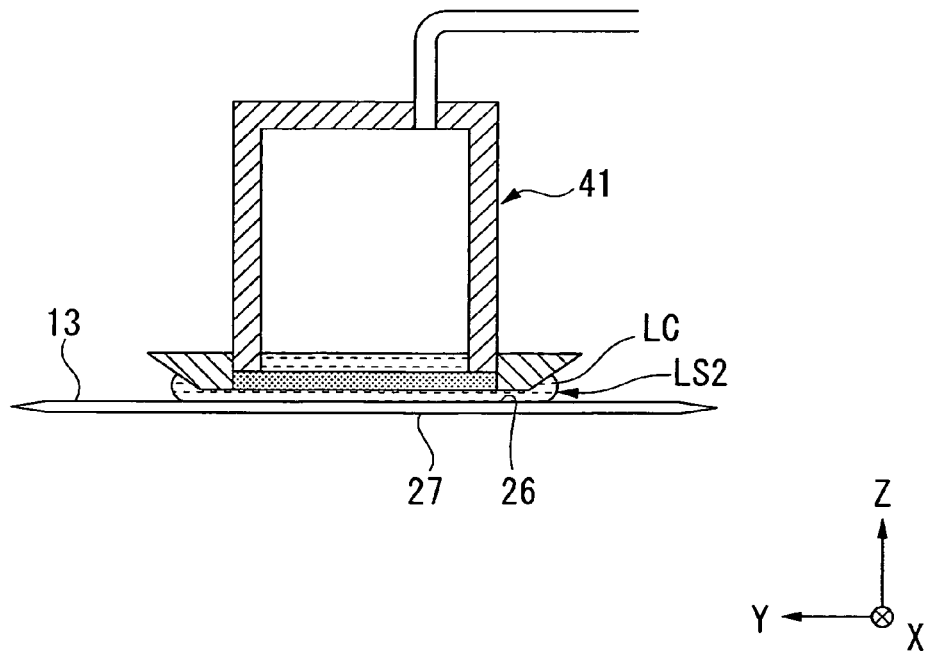
FIG. 18 is a typical view used to illustrate an example of an operation of the exposure apparatus.

As is shown in FIG. 17, in a state in which the second liquid LC is being held between the second immersion component 41 and the substrate stage 2, the control apparatus 8 inserts the cover component 13, which is located at the second position A2, between the second immersion component 41 and the substrate stage 2 so as to move it to the first position A1. In the present embodiment, the second position A2 is a position on the +Y side of the first position A1. The control apparatus 8 moves the cover component 13 in the −Y direction in synchronization with the movement of the substrate stage 2 in the −Y direction so that the cover component 13 is inserted between the second immersion component 41 and the substrate stage 2. When the cover component 13 is being inserted, the control apparatus 8 moves the cover component 13 at the speed Vb which is slower than the speed Vs of the substrate stage 2. As a result of the substrate stage 2 being moved in the −Y direction and the cover component 13 being moved in the −Y direction, the second liquid LC changes to the state shown in FIG. 17.

After the cover component 13 has been moved to the first position A1 and the operation to insert the cover component 13 has ended, the second liquid LC is held between the second immersion component 41 and the cover component 13 which is placed at the first position A1, so that the second immersion space LS2 is formed. Moreover, when the operation to insert the cover component 13 has ended, the second liquid LC is eliminated from between the cover component 13 and the substrate stage 2. After the second liquid LC has become held between the second immersion component 41 and the cover component 13, the substrate stage 2 is moved away from the second immersion component 41. As a result, the state changes to that shown in FIG. 18.

In the present embodiment, when the hold of the second liquid LC is being switched from between the second immersion component 41 and the substrate stage 2 to between the second immersion component 41 and the cover component 13, namely, when the cover component 13 is being inserted between the second immersion component 41 and the substrate stage 2, the speed Vs of the substrate stage 2 is faster than the speed Vb of the cover component 13. By employing this mode, after the operation to insert the cover component 13 (i.e., after the cover component 13 has been placed at the first position A1), any ingress of the second liquid LC to the area between the cover component 13 and the substrate stage 2 is prevented, and the second liquid LC is eliminated from between the cover component 13 and the substrate stage 2. For example, any ingress of the second liquid LC to the area between the cover component 13 and the substrate stage 2 is prevented by the surface tension of the second liquid LC. Accordingly, it is possible to prevent the second liquid LC remaining on the top surface 23 of the substrate stage 2. It is also possible to prevent the second liquid LC adhering to or remaining on the bottom surface 27 of the cover component 13.

Moreover, in the present embodiment, because the edges of the cover component 13 are formed at an acute angle (i.e., are sharp), during an operation to insert the cover component 13, it is possible to more effectively prevent any ingress of the second liquid LC to the area between the cover component 13 and the substrate stage 2, and to also more effectively prevent the second liquid LC becoming adhered to the bottom surface 27 of the cover component 13.

Moreover, in the present embodiment, the top surface 26 and bottom surface 27 of the cover component 13 are liquid-repellent towards the second liquid LC, and the top surface 23 of the substrate stage 2 is also liquid-repellent towards the second liquid LC. Accordingly, in an operation to insert the cover component 13, any ingress of the second liquid LC to the area between the cover component 13 and the substrate stage 2, and any adhesion of the second liquid LC to the bottom surface 27 of the cover component 13 are more effectively prevented.

Next, after the second liquid LC has become held between the second immersion component 41 and the cover component 13, the control apparatus 8 operates the second liquid processing apparatus 50 so that an operation to recover the second liquid LC from between the second immersion component 41 and the cover component 13 is executed. The second liquid LC which was held between the second immersion component 41 and the cover component 13 is recovered via the first bottom surface 43 of the porous component 47. As a result, the state changes to that shown in FIG. 19.

Figure 19:
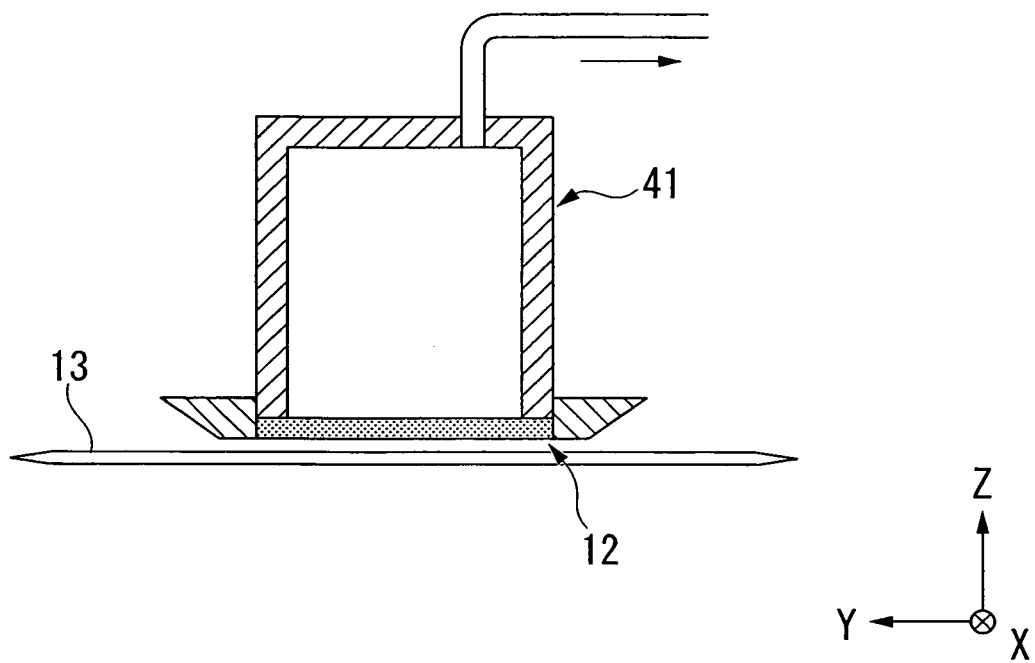
FIG. 19 is a typical view used to illustrate an example of an operation of the exposure apparatus.

As is shown in FIG. 19, even after the operation to recover the second liquid LC has been executed, by placing the cover component 13 at the first position A1, even if some of the second liquid LC remains temporarily on the bottom surface 42 and the like, this second liquid LC can be prevented from dropping onto peripheral components such as, for example, the base component 6 and the like.

As has been described above, according to the present embodiment, it is possible to excellently clean the top surface 23 of the substrate stage 2. Moreover, according to the present embodiment, it is possible to quickly switch the hold of the second liquid LC from between the second immersion component 41 and one of the cover component 13 and substrate stage 2 to between the second immersion component 41 and the other one of the cover component 13 and substrate stage 2. In other words, the substrate stage 2 (an object) and the cover component 13 (a second member) are moved in a direction (the Y direction) parallel to the XY plane so that the hold of the liquid LQ between the substrate stage 2 and a first member (i.e., at least a part of the cleaning apparatus 40, for example, at least the second immersion component 41 or the porous component 47) is switched to the hold of the liquid LQ between the cover component 13 and the first member. As a result, the time can be reduced for switching between the cover component 13 and the substrate stage 2 to hold the liquid LQ between itself on one side and the first member on the other side. Accordingly, it is possible to prevent any deterioration in the operating efficiency of the exposure apparatus EX, and to enhance the throughput. Moreover, even when a cleaning operation is not being performed, the cover component 13 makes it possible to prevent the second liquid LC splashing onto peripheral components. In addition, while the switching between the substrate stage 2 and the cover component 13, the relative speed between the substrate stage 2 and the cover component 13 is other than zero. As a result, any ingress of the liquid LQ to the area between the cover component 13 and the substrate stage 2 can be prevented while the switching. Furthermore, it is possible to prevent (discourage) the residual liquid from dropping from the cover component 13 and from adhering to the substrate stage 2 and the like.

Note that in the present embodiment, a description is given of an example in which the top surface 23 of the substrate stage 2 is cleaned while a dummy substrate is being held in the substrate holding portion 15, however, it is also possible, for example, to perform a cleaning operation in a state in which nothing is being held in the substrate holding portion 15 (i.e., in a state in which the substrate holding portion 15 is exposed). This makes it possible to also clean the substrate holding portion 15. It is also possible to remove the plate component T from the plate component holding portion 24 and also clean the plate component holding portion 24.

In the present embodiment, the cover component 13 is provided movably between the second immersion component 41 and the substrate stage 2. Alternatively, the cover component 13 can be provided movably between the first immersion component 9 and the substrate stage 2. In this case, the cover component 13 can be provided on each of the first and the second immersion component 9, 41, or the cover component 13 can be used both the first and the second immersion component 9, 41.

In the above-described embodiments, the relative speed between the substrate stage 2 and the cover component 13 is other than zero while both the first switching operation (i.e., the loading operation of the cover component 13) and a second switching operation (i.e., the unloading operation of the cover component 13). Alternatively, the relative speed can be other than zero while at least one of the first and the second switching operations. The relative speed in the first switching operation can be the same as that in the second switching operation, or can be different from that in the second switching operation. In the embodiments, the moving direction of the substrate stage 2 and the cover component 13 in the first switching operation is the same as that in the second switching operation. Alternatively, the same moving direction (the same orientation) can be applied.

Note also that in each of the above described embodiments, the optical path K on the emission side (i.e., image plane side) of the terminal optical element 10 in the projection optical system PL is filled with the liquid LQ (the first liquid LQ), however, for example, as is disclosed in PCT International Publication No. WO 2004/019128, it is also possible to employ a projection optical system in which the optical path on the entry side (i.e., object surface side) of the terminal optical element 10 is filled by the liquid LQ.

Note also that the liquid LQ (the first liquid LQ) in the above described embodiments is water, however, it is also possible to use a liquid other than water. As the liquid LQ, it is preferable to use a liquid which is transparent towards the exposure light EL and which has as high an index of refraction as possible. It is also preferable to use a liquid which is stable towards the projection optical system and towards the film of photosensitive material (i.e., photoresist) which forms the surface of a substrate. For example, as the liquid LQ is possible to use hydrofluoroether (HFE), perfluoropolyether (PFPE), Fomblin oil, cedar oil, and the like. It is also preferable that the liquid LQ has an index of refraction of approximately 1.6 through 1.8. Furthermore, it is also possible to form the optical elements of the projection optical system PL which come into contact with the liquid LQ (i.e., the terminal optical element and the like) from a material which has a higher index of refraction than that of quartz or fluorite (for example, 1.6 or more). It is also possible to use various fluids such as, for example, supercritical fluids for the liquid LQ.

Furthermore, when the exposure light EL is, for example, $F_2$ laser light, because this $F_2$ laser light does not pass through water, it is instead possible to use a fluorine-based fluid such as, for example, perfluoropolyether (PFPE) and fluorine-based oil, which do allow $F_2$ laser light to pass through, as the liquid LQ. In this case, lyophilization processing is performed on portions which come into contact with the liquid LQ by forming a thin film thereon from a substance which includes fluorine and has a low-polarity molecular structure.

Note also that as the substrate P in each of the above described embodiments, it is possible to use not only a semiconductor wafer which is used for manufacturing semiconductor devices, but also glass substrates used for display devices, ceramic wafers used for thin-film magnetic heads, and original plates (i.e., synthetic quartz or silicon wafers) of masks or reticules used in exposure apparatuses, and the like may be used.

As the exposure apparatus EX, in addition to a step-and-scan type of scanning exposure apparatus (i.e., a scanning stepper) which makes a scanning exposure of a pattern on a mask M while moving the mask M and a substrate P in synchronization with each other, it is also possible to use a step-and-repeat type of projection scanning device (i.e., a stepper) that collectively exposes the pattern on a mask M while the mask M and substrate P are stationary, and moves the substrate P in sequential steps.

Furthermore, in a step-and-repeat type of exposure, it is also possible to transfer to a contracted image of a first pattern onto a substrate P using a projection optical system while the first pattern and the substrate P are substantially stationary, and to then superimpose a reduced image of a second pattern partially onto the first pattern using the projection optical system while the second pattern and the substrate P are substantially stationary, and then collectively expose these onto the substrate P (i.e., using a stitch type of collective exposure apparatus). Moreover, as a stitch type of collective exposure apparatus, it is also possible to use a step-and-stitch type of exposure apparatus that partially superimposes and then transfers at least two patterns onto a substrate P, and moves the substrate P sequentially.

Moreover, as is disclosed, for example, in the corresponding U.S. Pat. No. 6,611,316, the present invention can also be applied to an exposure apparatus that synthesizes two mask patterns on a substrate via a projection optical system, and performs a double exposure substantially simultaneously of a single shot area on the substrate by means of a single scan exposure. The present invention can also be applied to a proximity type of exposure apparatus, or to be a mirror projection aligner or the like.

Moreover, the present invention can also be applied to a twin-stage type of exposure apparatus that is provided with a plurality of substrate stages such as is described in U.S. Pat. Nos. 6,341,007; 6,400,441; 6,549,269; 6,590,634; 6,208,407; and 6,262,796. For example, by applying the cover component 13 of the embodiment shown in FIG. 1 etc. to a twin-stage type of exposure apparatus, it is possible to prevent any reduction in throughput. Or, by applying the cleaning apparatus 40 and cover component 13 of the embodiment shown in FIG. 1 etc. to a twin-stage type of exposure apparatus, it is possible to excellently clean a substrate stage while preventing any reduction in throughput.

Furthermore, as is described in, for example, the corresponding U.S. Pat. No. 6,897,963, the present invention can also be applied to an exposure apparatus that is provided with a substrate stage that holds a substrate, and with a measurement stage on which is mounted a measurement member, which includes reference components on which reference marks are formed and/or various types of photoelectric sensors. The present invention can also be applied to an exposure apparatus that is provided with a plurality of substrate stages and measurement stages. In the exposure apparatus having the measurement stage, for example, it is possible to switch between the cover component 13 of the embodiment shown in FIG. 1 etc. and the measurement stage that can move to the first position A1 to hold the liquid LQ between itself on one side and the terminal optical element 10 and the immersion component 9 on the other side. Or, it is also possible to switch the hold of the second liquid LC from a hold between the second immersion component 41 and one of the cover component 13 of the embodiment shown in FIG. 10 etc. and a measurement stage which can be moved to the first position A1 to a hold between the second immersion component 41 and the other one of the cover component 13 of the above described embodiment and the measurement stage which can be moved to the first position A1. As a result, it is possible to excellently clean a measurement stage. The above-described object can include a movable object other than the substrate stage 2, such as the measurement stage.

The type of exposure apparatus EX that is used is not limited to an exposure apparatus for manufacturing a semiconductor device that exposes a semiconductor device pattern onto a substrate P, and the present invention may also be broadly applied to exposure apparatuses for manufacturing liquid crystal display elements or manufacturing displays and the like, and to exposure apparatuses for manufacturing thin-film magnetic heads, image pickup elements (CCD), micro machines, MEMS, DNA chips, or reticules and masks, and the like.

Note also that in each of the above described embodiments, the respective positional information of the mask stage 1 and the substrate stage 2 is measured using the interferometer system 7 which includes the laser interferometers 7A and 7B, however, the present invention is not limited to this and it is also possible to use, for example, an encoder system as disclosed in U.S. Patent Publication No. 2007/0288121, U.S. Patent Publication No. 2008/0088843, and U.S. Patent Publication No. 2006/0227309. In this case, it is also possible to employ a hybrid system which is provided with both an interferometer system and an encoder system. Alternatively, the interferometer system can measure a positional parameter of the mask stage 1, and the encoder system can measure a positional parameter of the substrate stage 2.

Moreover, in each of the above described embodiments, it is possible to use an ArF excimer laser as the light source apparatus which emits ArF excimer laser light as the exposure light EL, however, it is also possible to use, for example, a solid-state laser light source such as a DFB semiconductor laser or a fiber laser or the like such as is disclosed in U.S. Pat. No. 7,023,610, or a higher harmonic wave generating apparatus which includes an optical amplification portion having a fiber amp or the like and a wavelength conversion portion, and which outputs pulse light having a wavelength of 193 nm. Furthermore, in the above described embodiment, both the respective illumination areas and the projection area are each formed in a rectangular shape, however, it is also possible to use other shapes such as, for example, a circular arc shape or the like.

Note also that in each of the above described embodiments, a transparent mask that is obtained by forming a predetermined light-shielding pattern (or a phase pattern or light-reducing pattern) on an optically transparent substrate is used, however, instead of this mask, as is disclosed, for example, in U.S. Pat. No. 6,778,257, it is also possible to use a variable mold mask (also known as an electronic mask, an active mask, or an image generator) that forms a transmission pattern or a reflection pattern or a light-emission pattern based on electronic data for the pattern to be exposed. Variable mold masks include, for example, DMD (digital micro-mirror devices) which are a type of non-emission image display element (i.e., spatial optical modulator). Moreover, instead of a variable mold mask which is provided with a non-emission image display element, it is also possible for it to be provided with a pattern formation apparatus which includes a self-luminous image display element. Examples of the self-luminous image display element include a CRT (i.e., a cathode ray cube), an inorganic EL display, an organic EL display (i.e., an OLED: organic light emitting diode), an LED display, an LD display, an FED (i.e., a field emission display), and a PDP (i.e., a plasma display panel).

In each of the above described embodiments, an exposure apparatus provided with the projection optical system P1 is described as an example, however, the present invention can also be applied to an exposure apparatus and exposure method in which the projection optical system PL is not used. In cases such as this in which the projection optical system PL is not used, exposure light is irradiated onto a substrate via an optical component such as a lens or the like, and an immersion space is formed in a predetermined space between this optical component and the substrate.

As is described, for example, in PCT International Publication No. WO 2001/035168, it is also possible to apply the present invention to an exposure apparatus (i.e., a lithographic system) which exposes a line-and-space pattern on a substrate P by forming an interference fringe on the substrate P.

Figure 20:
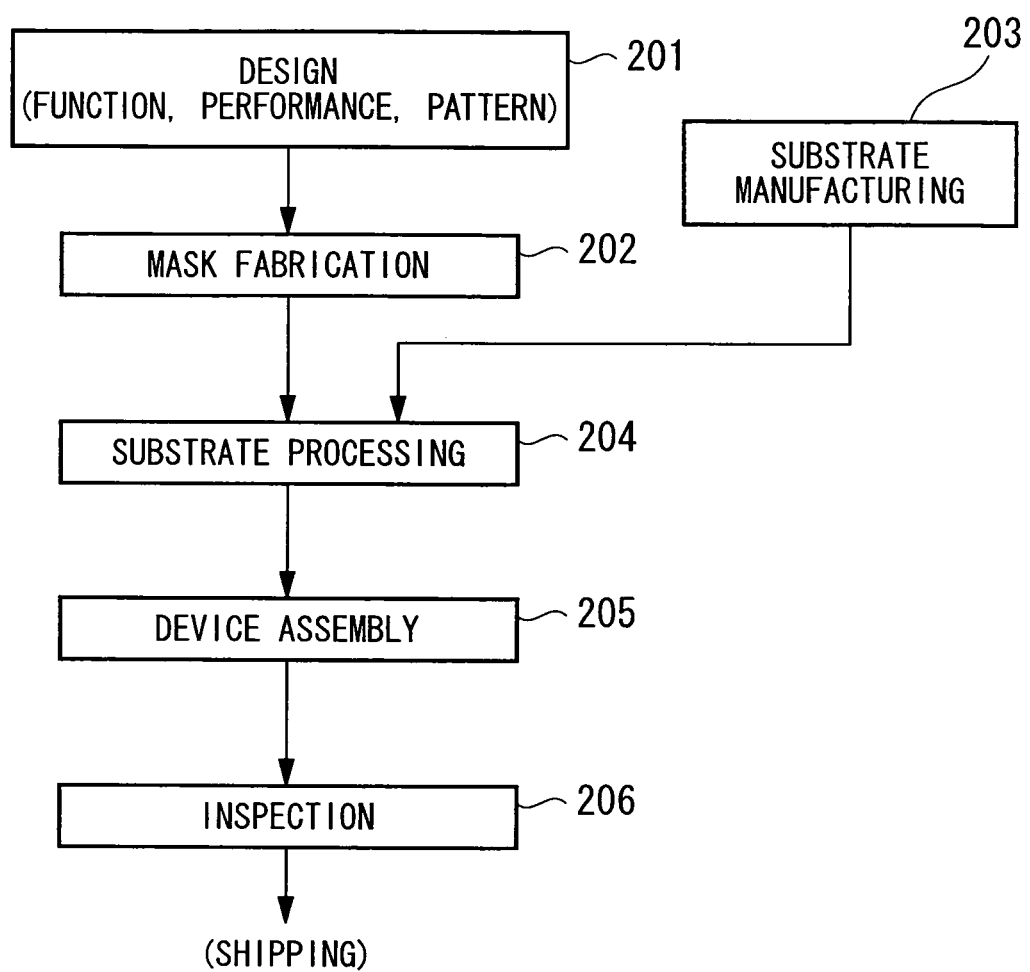
FIG. 20 is a flow chart used to illustrate an example of a micro device manufacturing process.

As has been described above, the exposure apparatus EX is manufactured by assembling various subsystems that include the respective component elements such that they have predetermined levels of mechanical accuracy, electrical accuracy, and optical accuracy. In order to secure these levels of accuracy, various adjustments are made before and after the assembly step, including adjustments to achieve optical accuracy in the various optical systems, adjustments to achieve mechanical accuracy in the various mechanical systems, and adjustments to achieve electrical accuracy in the various electrical systems. The assembly step to assemble an exposure apparatus from the various subsystems includes making mechanical connections, electrical circuit wiring connections, and air pressure circuit tube connections and the like between the various subsystems. Prior to the assembly step to assemble an exposure apparatus from the various subsystems, it is of course necessary to perform assembly steps to assemble the respective individual subsystems. Once the assembly step to assemble an exposure apparatus from the various subsystems has ended, comprehensive adjustments are made so as to secure various levels of accuracy in the exposure apparatus as a whole. Note that it is desirable for the manufacturing of the exposure apparatus to be conducted in a clean room in which temperature and cleanliness and the like are controlled As is shown in FIG. 20, a micro device such as a semiconductor device is manufactured via a step 201 in which the functions and performance of the micro device are designed, a step 202 in which a mask (i.e., a reticule) that is based on the design step is manufactured, a step 203 in which a substrate that forms the base material of the device is manufactured, a substrate processing step 204 that includes substrate processing (i.e., exposure processing) which includes exposing a substrate with exposure light using an image of a pattern on a mask, and then developing the exposed substrate, a device assembly step (including working processes such as a dicing step, a bonding step, a packaging step and the like) 205, and an inspection step 206.

Note that the conditions of each of the above described embodiments may be combined together as is appropriate. As far as is permitted, the disclosures in all of the documents and U.S. patents related to exposure apparatuses and the like cited in the above respective embodiments and modified examples, are incorporated herein by reference.

What is claimed is:
1. An exposure apparatus that exposes a substrate with exposure light via a liquid, comprising:
an object that has a surface and that is capable of moving in a predetermined plane, the surface being in contact with the liquid;
a first member to which the object faces and between which and the surface of the object the liquid is held; and
a second member that moves in a space between the first member and the object and that can form a space to hold the liquid between the first member and the second member,
wherein the object and the second member move in a direction substantially parallel to the predetermined plane in order to switch a hold of the liquid from between the first member and one of the object and the second member to between the first member and the other one of the object and the second member, wherein, in at least a part of the switching, a relative speed between the object and the second member is other than zero.

2. The exposure apparatus according to claim 1, wherein, when the switching is from the object to the second member, the relative speed is other than zero.

3. The exposure apparatus according to claim 2, wherein, when the switching is from the object to the second member, the speed of the object is higher than that of the second member.

4. The exposure apparatus according to claim 1, wherein, when the switching is from the second member to the object, the relative speed is other than zero.

5. The exposure apparatus according to claim 4, wherein, when the switching is from the second member to the object, the speed of the second member is higher than that of the object.

6. The exposure apparatus according to claim 1, wherein the first member comprises an optical member from which the exposure light exits.

7. The exposure apparatus according to claim 1, wherein the object comprises a mover that holds the substrate, the first member comprises an immersion member that forms an immersion space for the exposure, the immersion space being filled with a liquid between the first member and the mover.

8. The exposure apparatus according to claim 1, wherein the first member comprises a cleaning member that is used for cleaning a surface of the object.

9. The exposure apparatus according to claim 8, wherein the cleaning member comprises a porous member, and the first member comprises at least the porous member.

10. The exposure apparatus according to claim 8, wherein the object comprises a first mover that holds the substrate, in the exposure, the first mover holds a first liquid between itself and an optical member from which the exposure light exits, in the cleaning, the first mover holds a second liquid between itself and the first member.

11. The exposure apparatus according to claim 10, wherein wherein the object comprises a second mover that is capable of moving independent from the first mover, in the exposure, the second mover holds the first liquid between itself and the optical member, in the cleaning, the second mover holds the second liquid between itself and the first member.

12. The exposure apparatus according to claim 11, wherein the second member does not hold the substrate and has a measuring component.

13. The exposure apparatus according to claim 10, wherein the second liquid comprises a cleaning liquid that is different from the first liquid.

14. The exposure apparatus according to claim 1, wherein the first member has a surface which is liquid-repellent.

15. A device manufacturing method comprising:
exposing a substrate using the exposure apparatus according to claim 1; and
developing the exposed substrate.

16. A method of exposing a substrate with exposure light via a liquid, the method comprising:
disposing an object that is capable of moving in a predetermined plane so that the object faces a first member;
holding a liquid between the first member and the object;
providing a second member that moves at least in a space between the first member and the object and forming a space in which the liquid is held between the second member and the first member;
switching a hold of the liquid from between the first member and one of the object and the second member to between the first member and the other one of the object and the second member, the switching comprising moving the object and the second member in a direction substantially parallel to the predetermined plane,
wherein, in at least a part of the switching, a relative speed between the object and the second member is other than zero.

17. The exposure method according to claim 16, wherein, in the switching from the object to the second member, the relative speed is other than zero.

18. The exposure method according to claim 17, wherein, in the switching from the object to the second member, a speed of the object is higher than that of the second member.

19. The exposure method according to claim 16, wherein, in the switching from the second member to the object, the relative speed is other than zero.

20. The exposure method according to claim 19, wherein, in the switching from the second member to the object, a speed of the second member is higher than that of the object.

21. The exposure method according to claim 16, wherein the first member comprises an optical member from which the exposure light exits.

22. The exposure method according to claim 16, wherein the object comprises a mover that holds the substrate, the first member comprises an immersion member that forms an immersion space for the exposure, the immersion space being filled with the liquid between the first member and the mover.

23. The exposure method according to claim 16, wherein the first member comprises a cleaning member that is used for cleaning a surface of the object.

24. The exposure method according to claim 23, wherein the cleaning member comprises a porous member, and the first member comprises at least the porous member.

25. The exposure method according to claim 23, wherein the object comprises a first mover that holds the substrate, in the exposure, the first mover holds a first liquid between itself and an optical member from which the exposure light exits.

26. The exposure method according to claim 25, wherein the object comprises a second mover that is capable of moving independent from the first mover, in the exposure, the second mover holds the first liquid between itself and the optical member, in the cleaning, the second mover holds the second liquid between itself and the first member.

27. The exposure method according to claim 26, wherein the second member does not hold the substrate and has a measuring component.

28. The exposure method according to claim 25, wherein the second liquid comprises a cleaning liquid that is different from the first liquid.

29. The exposure method according to claim 16, wherein the first member has a surface which is liquid-repellent.

30. A device manufacturing method comprising:
exposing a substrate using the exposure method according to claim 16; and
developing the exposed substrate.

* * * * *